(12) United States Patent
Jang

(10) Patent No.: US 12,113,085 B2
(45) Date of Patent: Oct. 8, 2024

(54) IMAGE SENSING DEVICE

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 455 days.

(21) Appl. No.: 17/559,304

(22) Filed: Dec. 22, 2021

(65) Prior Publication Data
US 2022/0246650 A1 Aug. 4, 2022

(30) Foreign Application Priority Data

Feb. 3, 2021 (KR) .................. 10-2021-0015576

(51) Int. Cl.
H01L 27/146 (2006.01)
(52) U.S. Cl.
CPC .............................. H01L 27/1463 (2013.01)
(58) Field of Classification Search
CPC .......... H01L 27/1463; H01L 27/14603; G01S 17/894; G01S 7/4816; H04N 25/70; H04N 25/76
See application file for complete search history.

(56) References Cited

U.S. PATENT DOCUMENTS

2020/0328238 A1 10/2020 Shim

FOREIGN PATENT DOCUMENTS

| CN | 109785783 A | 5/2019 |
| CN | 110581147 A | 12/2019 |
| KR | 20180103124 A | 9/2018 |
| KR | 20200010045 A | 1/2020 |

OTHER PUBLICATIONS

First Office Action mailed on Jul. 31, 2024 for CN Appl. No. 202111542053.2, 9 pages with English translation.

Primary Examiner — Elias Ullah
(74) Attorney, Agent, or Firm — Perkins Coie LLP

(57) ABSTRACT

An image sensing device includes a plurality of unit pixels, each of which includes a plurality of sub-pixels. Each of the unit pixels is structured to respond to incident light to produce photocharges indicative of detected incident light and includes sub-pixels. Each sub-pixel includes a control region configured to generate, within a substrate in which the sub-pixels are disposed, a current that carries the photocharges, a detection region spaced from the control region and configured to capture the photocharges carried by the current, a plurality of first isolation portions disposed between two adjacent sub-pixels, a second isolation portion disposed to surround the sub-pixels, and a voltage applying region disposed at a center portion of the unit pixel and configured to receive a first voltage.

20 Claims, 9 Drawing Sheets

IMAGE SENSING DEVICE

CROSS-REFERENCE TO RELATED APPLICATION

This disclosure claims the priority and benefits of Korean patent application No. 10-2021-0015576, filed on Feb. 3, 2021, the disclosure of which is incorporated by reference in its entirety as part of the disclosure of this disclosure.

TECHNICAL FIELD

The technology and implementations disclosed in this disclosure generally relate to an image sensing device capable of sensing a distance to a target object.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices.

The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device having a structure optimized for discriminating detection signals between adjacent sub-pixels.

In one aspect, an image sensing device is provided to comprise: a plurality of unit pixels, each of which includes a plurality of sub-pixels. Each of the unit pixels includes: a plurality of first isolation portions disposed between the sub-pixels adjacent to each other; a second isolation portion formed to surround the sub-pixels; and a voltage applying region disposed at a center portion of the unit pixel, and configured to receive a first voltage as an input. Each of the sub-pixels includes: a control region formed to generate a current within a substrate in which the sub-pixels are disposed; and a detection region formed to capture electrons moving by the current.

In another aspect, an image sensing device is provided to include a plurality of unit pixels, wherein each of the unit pixels is structured to respond to incident light to produce photocharges indicative of detected incident light and includes sub-pixels. Each sub-pixel includes a control region configured to generate, within a substrate in which the sub-pixels are disposed, a current that carries the photocharges, a detection region spaced from the control region and configured to capture the photocharges carried by the current, a plurality of first isolation portions disposed between two adjacent sub-pixels, a second isolation portion disposed to surround the sub-pixels, and a voltage applying region disposed at a center portion of the unit pixel and configured to receive a first voltage.

In some implementations, each of the first isolation portions and the second isolation portion are configured to receive a ground voltage higher than the first voltage.

In some implementations, wherein each of the first isolation portions includes a first doped region having a first depth, a second doped region having a second depth and a third doped region formed to have a third depth, wherein a sum of the first depth, the second depth, and the third depth is identical to a depth of the substrate.

In some implementations, the first doped region and the second doped region have different doping densities from each other.

In some implementations, the second isolation portion includes a fourth doped region having a fourth depth, a fifth doped region having a fifth depth and a sixth doped region having a sixth depth, wherein a sum of the fourth depth, the fifth depth, and the sixth depth is identical to a depth of the substrate.

In some implementations, the fourth doped region and the fifth doped region have different doping densities from each other.

In some implementations, the control region is configured to receive a demodulation control signal having a second voltage during a first period time and a third voltage during a second period of time.

In some implementations, each of the second voltage and the third voltage is higher than the first voltage.

In some implementations, the sub-pixels include a first to fourth sub-pixels to which different demodulation control signals are applied.

In some implementations, a first to firth demodulation control signals are applied to the first to fourth sub-pixels, respectively, and wherein the first demodulation control signal has a phase difference of 90° with respect to the second demodulation control signal, the second demodulation control signal has a phase difference of 90° with respect to the third demodulation control signal, the third demodulation control signal has a phase difference of 90° with respect to the fourth demodulation control signal, and the fourth demodulation control signal has a phase difference of 90° with respect to the first demodulation control signal.

In some implementations, the detection region is disposed between the control region and the second isolation portion.

In some implementations, the detection region is disposed to surround the control region, wherein an opening is disposed between the control region and the voltage applying region.

In some implementations, the current flows from each of the control region, the first isolation portions, and the second isolation portion toward the voltage applying region.

In some implementations, the voltage applying region is spaced apart from each of the first isolation portions.

In another aspect, an image sensing device is provided to comprise: a voltage applying region disposed at a center portion of a unit pixel in which a plurality of sub-pixels is arranged in a (2×2) matrix array; a first isolation portion formed to isolate the sub-pixels from other adjacent sub-pixels; and a second isolation portion formed to isolate the sub-pixels from other adjacent unit pixels, wherein a first voltage applied to the voltage applying region is a negative voltage.

In another aspect, an image sensing device is provided to include sub-pixels arranged in a matrix array, each sub-pixel including a photoelectric conversion region configured to produce photocharges in response to incident light, a first isolation portion disposed to isolate any two adjacent sub-pixels from each other a second isolation portion disposed along edges of the sub-pixels and, a voltage applying region disposed at a central portion of the matrix array and configured to receive a first voltage that is a negative voltage.

In some implementations, each of the sub-pixels may include a detection region configured to capture the photocharges moving along a current and a control region configured to allow the current to flow toward the first isolation portion, the second isolation portion, and the voltage applying region.

In some implementations, the control region is further configured to generate the hole current by receiving a control signal having a second voltage or a third voltage.

In some implementations, the voltage applying region is disposed spaced apart from the first isolation portion and the second isolation portion.

In some implementations, the first isolation portion and the second isolation portion are coupled to each other.

In some implementations, voltages applied to the first isolation portion and the second isolation portion are different from the first voltage.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
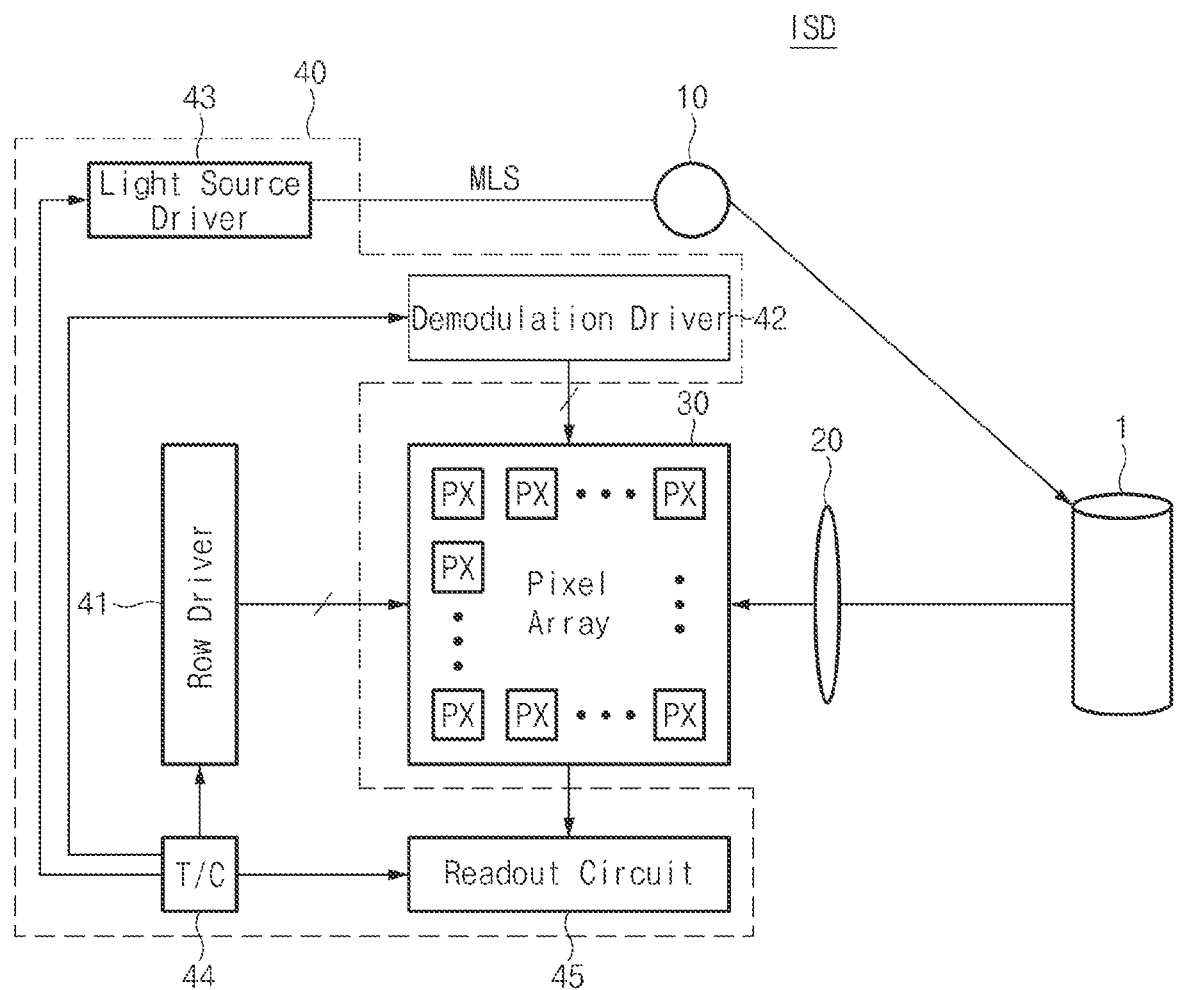
FIG. 1 is a block diagram illustrating an example of an image sensing device based on some implementations of the disclosed technology.

This disclosure provides implementations and examples of an image sensing device capable of sensing a distance to a target object. Some implementations of the disclosed technology relate to the image sensing device having a structure optimized for discriminating detection signals between adjacent sub-pixels. The disclosed technology provides the image sensing device which can allow a control region included in a unit pixel to be surrounded by isolation portions, such that electron detection efficiency can be improved and signal interference between adjacent sub-pixels can be reduced. The disclosed technology provides the image sensing device in which a voltage input region is located at the center of each unit pixel, such that signal interference between adjacent sub-pixels can be reduced and electron transfer efficiency can be improved.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

There have been much developments and studies for measuring range and depth (i.e., a distance to a target object) using image sensing devices. For example, demand for the above-mentioned depth measurement schemes using image sensors is rapidly increasing in various devices, for example, security devices, medical devices, automobiles, game consoles, virtual reality (VR)/augmented reality (AR) devices, mobile devices, etc. Methods for measuring depth information using one or more image sensors are mainly classified into a triangulation method, a Time of Flight (TOF) method, and an interferometry method. In more detail, the Time of Flight (TOF) method from among the above-mentioned depth measurement methods has many more available technical fields, can be processed and operate at a higher speed, and has superior cost efficiency, such that the TOF method has a higher degree of importance.

The TOF method may be mainly classified into a direct method and an indirect method. Although the principles in which the distance (i.e., depth) to a target object is calculated using emitted light and reflected light are commonly applied to the direct method and the indirect method, the direct method and the indirect method may have different measurement methods.

The direct method may calculate a round trip time, and may measure the distance to a target object using the calculated round trip time. The indirect method may measure the distance to the target object using a phase difference. The direct method has advantages in terms of long-distance measurement, such that the direct method has been widely used in automobiles and the like. The indirect method has advantages in terms of short-distance measurement, such that the indirect method has been widely used in various higher-speed devices designed to operate at a higher speed, for example, game consoles, mobile cameras, or the like.

The indirect method has higher simplicity in circuit design, such that the indirect method can be implemented using relatively lower costs.

A Current-Assisted Photonic Demodulator (CAPD) method serving as any one of pixel types corresponding to indirect TOF sensors is a method for detecting electrons that have been generated in pixels using a majority current acquired by applying a voltage to a substrate, using a difference in potential between electric fields. In this way, since the CAPD method is designed to use the majority current, the CAPD method can more quickly detect electrons and can detect some electrons formed at a deep depth, such that the CAPD method has superior efficiency.

FIG. 1 is a block diagram illustrating an example of an image sensing device ISD based on some implementations of the disclosed technology.

Referring to FIG. 1, the image sensing device ISD may measure the distance to a target object 1 using the Time of Flight (TOF) principle. The image sensing device ISD may include a light source 10, a lens module 20, a pixel array 30, and a control block 40.

The light source 10 may emit light to a target object 1 upon receiving a light modulation signal MLS from the control block 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source combined with a white lamp or a monochromator, and a combination of other laser sources. For example, the light source 10 may emit infrared light having a wavelength of 800 nm to 1000 nm. Light emitted from the light source 10 may be light (i.e., modulated light) modulated by a predetermined frequency. Although FIG. 1 shows only one light source for convenience of description, the scope or spirit of the disclosed technology is not limited thereto, and a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in a two-dimensional (2D) matrix structure in which unit pixels are arranged in a column direction and a row direction perpendicular to the column direction. The unit pixel (PX) may be a minimum unit that is repeatedly arranged in the same shape within the pixel array. Each of the unit pixels may include a plurality of sub-pixels arranged in a matrix array, resulting in formation of the unit pixels each having the sub-pixels.

The unit pixels (PXs) may be formed over a semiconductor substrate. Each unit pixel (PX) may convert incident light received through the lens module 20 into an electrical signal corresponding to the amount of incident light, and may thus output a pixel signal using the electrical signal. In this case, the pixel signal may not indicate the color of the target object 1, and may be a signal indicating the distance to the target object 1.

Each unit pixel (PX) may be a Current-Assisted Photonic Demodulator (CAPD) pixel. The structure and operations of each unit pixel (PX) will hereinafter be described with reference to the drawings from FIG. 2.

The control block 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control block 40 may include a row driver 41, a demodulation driver 42, a light source driver 43, a timing controller 44, and a readout circuit 45.

The row driver 41 may drive unit pixels (PXs) of the pixel array in response to a timing signal generated from the timing controller 44. For example, the row driver 41 may generate a control signal capable of selecting and controlling at least one row line from among the plurality of row lines. The control signal may include a reset signal RST for controlling a reset transistor, a transfer signal TRG for controlling transmission of photocharges accumulated in a detection region, a floating diffusion signal FDG for providing additional electrostatic capacity at a high illuminance level, a selection signal SEL for controlling a selection transistor, and the like.

Although FIG. 1 illustrates the row driver 41 arranged in a column direction (i.e., a vertical direction) of the pixel array 30 for convenience of description, at least some parts of the row driver 41 may be arranged in a row direction (i.e., a horizontal direction) of the pixel array 30.

The demodulation driver 42 may generate a demodulation control signal capable of being applied to at least one sub-pixel from among the plurality of sub-pixels in response to a timing signal generated from the timing controller 44. The demodulation control signal may generate a potential difference in the substrate. The potential difference generated in the substrate may generate a hole current for moving electrons of the substrate.

The light source driver 43 may generate a light modulation signal MLS capable of driving the light source 10 in response to a control signal from the timing controller 44. The light modulation signal MLS may be a signal that is modulated by a predetermined frequency.

The timing controller 44 may generate a timing signal to control the row driver 41, a demodulation driver 42, the light source driver 43, and the readout driver 45.

The readout driver 45 may process pixel signals received from the pixel array 30 under control of the timing controller 44, and may thus generate pixel data formed in a digital signal shape. To this end, the readout driver 45 may include a correlated double sampler (CDS) circuit for performing correlated double sampling (CDS) on the pixel signals generated from the pixel array 30.

In addition, the readout driver 45 may include an analog-to-digital converter (ADC) for converting output signals of the CDS circuit into digital signals. In addition, the readout driver 45 may include a buffer circuit that temporarily stores pixel data generated from the analog-to-digital converter (ADC) and outputs the pixel data under control of the timing controller 44. In the meantime, since the pixel array 30 includes CAPD pixels, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a predetermined frequency to a scene captured by the image sensing device ISD. The image sensing device ISD may sense modulated light (i.e., incident light) reflected from the target objects 1 included in the scene, and may thus generate depth information for each unit pixel (PX).

A time delay based on the distance between the image sensing device ISD and each target object 1 may occur between the modulated light and the incident light. The time delay may be denoted by a phase difference between the signal generated by the image sensing device ISD and the light modulation signal MLS controlling the light source 10. An image processor (not shown) may calculate a phase difference generated in the output signal of the image sensing device ISD, and may thus generate a depth image.

Figure 2:
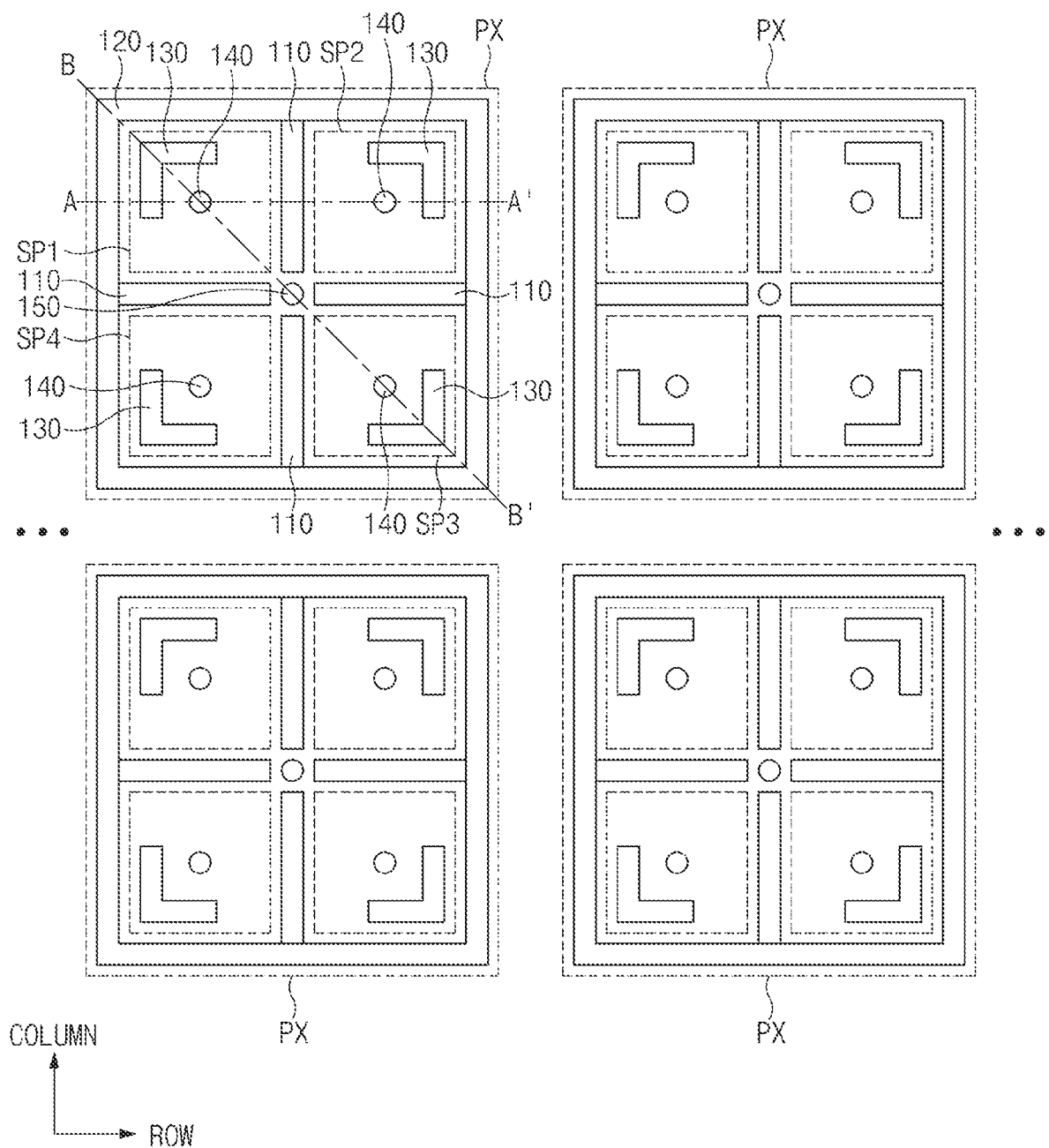
FIG. 2 is a schematic diagram illustrating an example of a pixel array based on some implementations of the disclosed technology.

FIG. 2 is a schematic diagram illustrating an example of the pixel array 30 based on some implementations of the disclosed technology.

Although FIG. 2 illustrates that the pixel array 30 includes four unit pixels arranged in a matrix array including two rows and two columns, other implementations are also possible. Thus, the pixel array 30 can include an arbitrary number of unit pixels (for example, pixel array 30 can include N unit pixels), N is a positive integer.

Each of the unit pixels (PXs) may include first to fourth sub-pixels SP1 to SP4. The unit pixels (PXs) may be substantially identical in structure to each other, so that the following description will hereinafter be focused on one unit pixel (PX) located at a first-row-and-first-column position in the matrix array including the unit pixels (PXs) shown in FIG. 2.

Each unit pixel (PX) may include first to fourth sub-pixels SP1 to SP4, one or more first isolation portions 110 disposed between any two adjacent sub-pixels, a second isolation portion 120 formed to surround the adjacent sub-pixels, and a voltage applying region 150 located at the center of the unit pixel (PX).

In some implementations, the first isolation portion 110 may be disposed between any two adjacent sub-pixels, e.g., between the first sub-pixel SP1 and the second sub-pixel SP2 that adjacent to each other, between the second sub-pixel SP2 and the third sub-pixel SP3 that are adjacent to each other, between the third sub-pixel SP3 and the fourth sub-pixel SP4 that are adjacent to each other, and/or between the first sub-pixel SP1 and the fourth sub-pixel SP4 that are adjacent to each other.

The second isolation portion 120 may be disposed along edges of the sub-pixels of the unit pixel. The second isolation portion 120 may be formed to surround the sub-pixels (e.g., SP1 to SP4) of the unit pixel. In the example of FIG. 2, the unit pixel includes four adjacent sub-pixels (e.g., SP1 to SP4) that are formed in a (2×2) matrix array. The second isolation portion 120 may be disposed to isolate sub-pixels of adjacent unit pixels. The sub-pixels of the unit pixel (PX) may be isolated from sub-pixels of another unit pixel (PX) by a second isolation portion 120.

The first isolation portion 110 and the second isolation portion 120 may be coupled to each other. In some implementations, the first isolation portion 110 and the second isolation portion 120 may be simultaneously formed through an impurity implantation process. In some implementations, the same voltage may be applied to the first isolation portion 110 and the second isolation portion 120. In some implementations, the first isolation portion 110 and the second isolation portion 120 may be physically connected to each other.

Flow of electrons between adjacent sub-pixels may be controlled in response to the voltage applied to the first isolation portion 110. For example, the current flowing between the control regions 140 respectively contained in the adjacent sub-pixels SP1 to SP4 can be reduced by applying a voltage to the first isolation portion 110 and allowing a current to flow between the control region 140 and the first isolation portion 110.

In addition, movement of electrons between adjacent unit pixels may be controlled in response to a voltage applied to the second isolation portion 120. For example, the current flowing between the control regions 140 respectively contained in the adjacent unit pixels (PXs) may be reduced by applying a voltage to the second isolation portion 120 and allowing a current to flow between the second isolation portion 120 and the control region 140.

With the first isolation portion 110 and the second isolation portion 120, noise generated by electron movement between adjacent sub-pixels SP1~SP4 or adjacent unit pixels (PXs) can be reduced.

The voltage applying region 150 may be disposed at the center of each unit pixel (PX). The center of the unit pixel (PX) may be located at the same distance from the center of each of the first to fourth sub-pixels SP1~SP4 included in each unit pixel (PX).

The voltage applying region 150 may be spaced apart from the first isolation portion 110. As the voltage applying region 150 is spaced apart from the first isolation portion 110, different voltages may be applied to the voltage applying region 150 and the first isolation portion 110.

Each of the first to fourth sub-pixels SP1 to SP4 may include a detection region 130 and a control region 140, both of which are structured to be electrically conductive and can be used to receive voltage signals to be electrically biased to capture electrons in each sub-pixel. In this case, the detection region 130 may be disposed between the control region 140 and the second isolation portion 120, and may receive a detection voltage.

The detection region 130 may capture electrons moving along a current flowing between the control region 140 and the voltage applying region 150, a current flowing between the control region 140 and the second isolation portion 120, and/or a current flowing between the control region 140 and the first isolation portion 110.

Demodulation control signals having different phase differences may be applied to the control regions 140 respectively included in the first to fourth sub-pixels SP1 to SP4, respectively. Each of the demodulation control signals may be a signal having an activation voltage during a first period of time or a deactivation voltage during a second period of time. The demodulation control signal may have the same phase difference as the modulated light, or may have a predetermined phase difference with respect to the modulated light.

Four sub-pixels SP1 to SP4 included in the unit pixel (PX) may detect electrons corresponding to incident light that is incident at a time point where the demodulation control signal applied to each of the sub-pixels SP1 to SP4 has an activation voltage with respect to the incident light.

Figure 3:
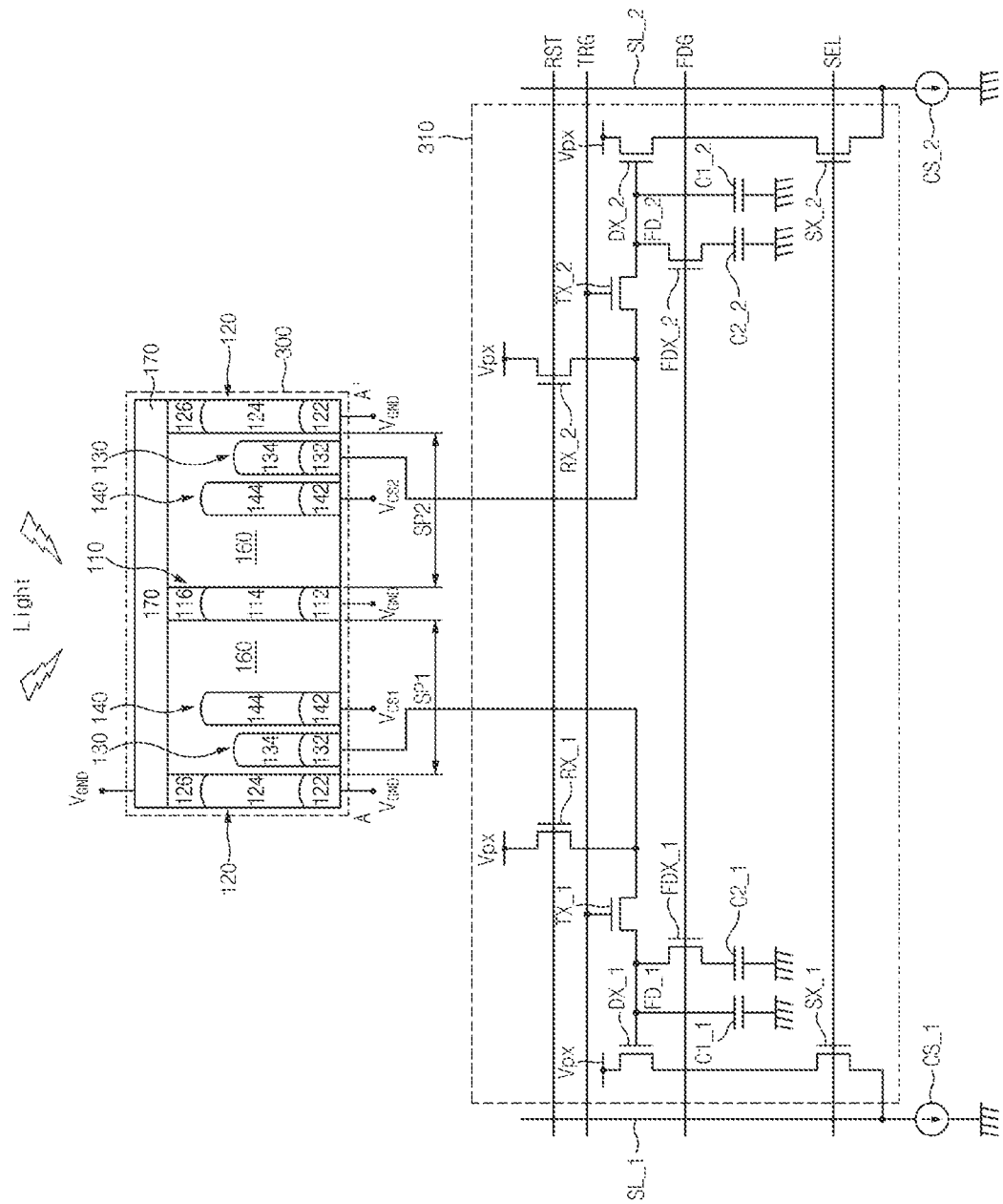
FIG. 3 is a schematic diagram illustrating the connection relationship between a cross-section of a unit pixel taken along a first cutting line shown in FIG. 2 and constituent circuits connected to first and second sub-pixels based on some implementations of the disclosed technology.

FIG. 3 is a schematic diagram illustrating the connection relationship between a cross-section of the unit pixel (PX) taken along the first cutting line A-A' shown in FIG. 2 and constituent circuits connected to first and second sub-pixels SP1 and SP2 based on some implementations of the disclosed technology.

The structure and operations of the unit pixel (PX) will hereinafter be described with reference to the cross-section of the unit pixel (PX) taken along the first cutting line A-A' shown in FIG. 2 and the circuits connected to the unit pixel (PX).

The unit pixel (PX) shown in FIG. 3 may further include a photoelectric conversion region 160 and a passivation layer 170 in addition to the first isolation portion 110, the second isolation portion 120, the detection region 130, the control region 140, and the voltage applying region 150 shown in FIG. 2.

The region in which the first isolation portion 110, the second isolation portion 120, the detection region 130, the control region 140, the voltage applying region 150, the photoelectric conversion region 160, and the passivation layer 170 are located will hereinafter be referred to as a sensing region 300. Electrons corresponding to incident light may be generated in the sensing region 300.

The first isolation portion 110, the second isolation portion 120, the detection region 130, the control region 140, and the passivation layer 170 may be formed over a semiconductor substrate or an epitaxial layer. For example, the semiconductor substrate may refer to a silicon wafer, and the epitaxial layer may refer to a crystal growth layer formed on the silicon wafer. Thus, the sensing region 300 may be formed over the semiconductor substrate, and light (i.e., incident light) may be incident upon one surface of the semiconductor substrate. In this case, the surface upon which light is incident will hereinafter be referred to as a light reception surface.

Each of the first isolation portion 110, the second isolation portion 120, the detection region 130, and the control region 140 may be formed to have a predetermined depth from a surface facing or opposite to the light reception surface of the incident light with respect to the semiconductor substrate or the epitaxial layer.

The second isolation portion 120 may be formed to have the same depth as the semiconductor substrate or the epitaxial layer so that the photoelectric conversion regions 160 included in the adjacent unit pixels (PXs) can be physically isolated from each other. In addition, the first isolation portion 110 and the second isolation portion 120 may be formed to have the same depth.

The first isolation portion 110 and the second isolation portion 120 may be doped with the same impurities. For example, the first isolation portion 110 and the second isolation portion 120 may be doped with P-type impurities.

The first isolation portion 110 and the second isolation portion 120 may include a plurality of doped regions having different impurity densities. For example, the first isolation portion 110 may include a first doped region 112, a second doped region 114, and a third doped region 116. In addition, the second isolation portion 120 may include a fourth doped region 122, a fifth doped region 124, and a sixth doped region 126.

The first doped region 112 may be doped with a higher density than each of the second doped region 114 and the third doped region 116. The second doped region 114 may be doped with a higher density than the third doped region 116, or may be doped with the same density as the third doped region 116. Each of the first doped region 112, the second doped region 114, and the third doped region 116 may be doped with P-type impurities.

The fourth doped region 122 may be doped with a higher density than each of the fifth doped region 124 and the sixth doped region 126. The fifth doped region 124 may be doped with a higher density than the sixth doped region 126, or may be doped with the same density as the sixth doped region 126. Each of the fourth doped region 122, the fifth doped region 124, and the sixth doped region 126 may be doped with P-type impurities.

The plurality of doped regions included in the first isolation portion 110 and the plurality of doped regions included in the second isolation portion 120 may be formed through the same process according to the doping concentrations (densities). For example, the third doped region 116 included in the first isolation portion 110 may be formed through the same ion implantation process as the sixth doped region 126 included in the second isolation portion 120. In some implementations, the first doped region 112 may be formed through the same ion implantation process as the fourth doped region 122, and the second doped region 114 may be formed through the same ion implantation process as the fifth doped region 124.

A depth of the first doped region 112 in the substrate may be referred to as a first depth. In addition, a depth of the second doped region 114 in the substrate may be referred to as a second depth. A depth of the third doped region 116 in the substrate may be referred to as a third depth.

The first depth may refer to a depth measured in the direction from one surface facing or opposite to a light reception surface of incident light to a boundary between the first doped region 112 and the second doped region 114. The second depth may refer to a depth measured in the direction from a boundary between the first doped region 112 and the second doped region 114 to a boundary between the second doped region 114 and the third doped region 116. The third depth may refer to a depth measured in the direction from a boundary between the second doped region 114 and the third doped region 116 to a boundary between the third doped region 116 and the passivation layer 170. Thus, the sum of the first to third depths may be equal to a thickness of the semiconductor substrate or a thickness of the epitaxial layer.

A depth of the fourth doped region 122 in the substrate may be referred to as a fourth depth. In addition, a depth of the fifth doped region 124 in the substrate may be referred to as a fifth depth.

A depth of the sixth doped region 126 in the substrate may be referred to as a sixth depth.

The fourth depth may refer to a depth measured in the direction from one surface facing or opposite to a light reception surface of incident light to a boundary between the fourth doped region 122 and the fifth doped region 124. The fifth depth may refer to a depth measured in the direction from a boundary between the fourth doped region 122 and the fifth doped region 124 to a boundary between the fifth doped region 124 and the sixth doped region 126. The sixth depth may refer to a depth measured in the direction from a boundary between the fifth doped region 124 and the sixth doped region 126 to a boundary between the sixth doped region 126 and the passivation layer 170. Thus, the sum of the fourth to sixth depths may be equal to a thickness of the semiconductor substrate or a thickness of the epitaxial layer.

In some implementations, the first depth may be identical to the fourth depth, and the second depth may be identical to the fifth depth. In addition, the third depth may be identical to the sixth depth.

As previously described above, a ground voltage ($V_{GND}$) may be applied to the first isolation portion 110 and the second isolation portion 120. For example, the ground voltage ($V_{GND}$) may be zero volts (0V). The ground voltage ($V_{GND}$) may be applied to the first doped region 112 and the fourth doped region 122.

The detection region 130 and the control region 140 may be included in each of the sub-pixels SP1 to SP4 included in the unit pixel (PX). As can be seen from the cross-section of the unit pixel taken along the first cutting line A-A' shown in FIG. 2, each of the first sub-pixel SP1 and the second sub-pixel SP1 may include the detection region 130 and the control region 140.

The detection region 130 may be doped with impurities different from those of the first isolation portion 110 and the second isolation portion 120. For example, the detection region 130 may be doped with N-type impurities.

The detection region 130 may include a plurality of doped regions having different impurity densities. For example, the detection region 130 may include a seventh doped region 132 and an eighth doped region 134. The seventh doped region 132 may have a higher density than the eighth doped region 134. A seventh depth where the seventh doped region 132 is formed in the substrate may be smaller than an eighth depth where the eighth doped region 134 is formed in the substrate.

The seventh depth may refer to a depth measured in the direction from one surface facing or opposite to a light reception surface of incident light to a boundary between the seventh doped region 132 and the eighth doped region 134. The eighth depth may refer to a depth measured in the direction from a boundary between the seventh doped region 132 and the eighth doped region 134 to a boundary between the eighth doped region 134 and the photoelectric conversion region 160.

The detection region 130 may receive a detection voltage as an input. A plurality of circuits may be coupled to the detection region 130 so that the detection region 130 can process collected electrons and convert the electrons into an electrical signal. The plurality of circuits may be formed in each of sub-pixels (e.g., SP1 and SP2) respectively including the detection regions 130.

The control region 140 may be doped with the same impurities as the first isolation portion 110 and the second isolation portion 120.

For example, the control region 140 may be doped with P-type impurities.

The control region 140 may include a plurality of doped regions having different impurity densities. For example, the control region 140 may include a ninth doped region 142 and a tenth doped region 144.

The ninth doped region 142 may have a higher density than the tenth doped region 144. A ninth depth where the ninth doped region 142 is formed in the substrate may be smaller than a tenth depth where the tenth doped region 144 is formed in the substrate.

The ninth depth may refer to a depth measured in the direction from one surface facing or opposite to a light reception surface of incident light to a boundary between the ninth doped region 142 and the tenth doped region 144. The tenth depth may refer to a depth measured in the direction from a boundary between the ninth doped region 142 and the tenth doped region 144 to a boundary between the tenth doped region 144 and the photoelectric conversion region 160.

The demodulation control signals $V_{CS1}$~$V_{CS4}$ respectively corresponding to the sub-pixels SP1~SP4 may be applied to the control regions 140 of the sub-pixels SP1~SP4. As described above, the demodulation control signals $V_{CS1}$~$V_{CS4}$ may have different phase differences.

For example, the first demodulation control signal ($V_{CS1}$) may be applied to the control region 140 included in the first sub-pixel SP1, the second demodulation control signal ($V_{CS2}$) may be applied to the control region 140 included in the second sub-pixel SP2, the third demodulation control signal ($V_{CS3}$) may be applied to the control region 140 included in the third sub-pixel SP3, and the fourth demodulation control signal ($V_{CS4}$) may be applied to the control region 140 included in the fourth sub-pixel SP4.

Each of the demodulation control signals $V_{CS1}$ to $V_{CS4}$ may allow a second voltage ($V_2$) and a third voltage ($V_3$) to be repeatedly applied to the control regions 140 at intervals of a predetermined time.

The second voltage ($V_2$) applied to the control region 140 may refer to a voltage generated when a current occurs between the control region 140 and the first isolation portion 110 included in each of the sub-pixels SP1 to SP4, between the control region 140 and the second isolation portion 120 included in each of the sub-pixels SP1 to SP4, and/or between the control region 140 and the voltage applying region 150 included in each of the sub-pixels SP1 to SP4.

The above-mentioned current may be referred to as a Hall current. As the Hall current is generated, the detection region 130 adjacent to the control region 140 can capture electrons. For example, the second voltage ($V_2$) may be 1.2 volts (1.2 V). A logic value of the demodulation driver 42 for applying the second voltage ($V_2$) may be at a logic high level (H).

The third voltage ($V_3$) applied to the control region 140 may refer to a voltage generated when no current occurs between the control region 140 and the first isolation portion 110 included in each of the sub-pixels SP1 to SP4, and/or between the control region 140 and the second isolation portion 120 included in each of the sub-pixels SP1 to SP4. For example, the third voltage ($V_3$) may refer to a ground voltage ($V_{GND}$). A logic value of the demodulation driver 42 for applying the third voltage ($V_3$) may be at a logic low level (L).

Each of the demodulation control signals may allow the second voltage ($V_2$) and the third voltage ($V_3$) to be applied to the control region 140 at intervals of a predetermined time.

The demodulation control signals respectively applied to the sub-pixels will be described later with reference to FIG. 5.

The photoelectric conversion region 160 may be disposed for the sub-pixels SP1 to SP4 included in the unit pixel (PX).

The photoelectric conversion region 160 may be arranged to occupy a space as large as possible to increase light reception (Rx) efficiency of the unit pixel (PX).

The photoelectric conversion region 160 may receive incident light, and may generate electrons corresponding to the received incident light.

The detection region 130 may capture electrons corresponding to the received light, and may thus generate a phase signal.

Since the first isolation portion 110 is formed to be spaced apart from the voltage applying region 150, the photoelectric conversion region 160 included in one unit pixel (PX) may not be completely isolated for each sub-pixel.

The second isolation portion 120 may be formed to surround the sub-pixels (e.g., SP1 to SP4) included in each unit pixel (PX), and may be formed to have the same depth as the substrate or the epitaxial layer, so that the photoelectric conversion regions 160 contained in adjacent unit pixels (PXs) can be isolated from each other.

The passivation layer 170 may be formed by doping P-type impurities over the semiconductor substrate or the epitaxial layer.

A ground voltage ($V_{GND}$) may be applied to the passivation layer 170. For example, the ground voltage ($V_{GND}$) may be zero volts (0V). Since the ground voltage ($V_{GND}$) is applied to the passivation layer 170, a current may flow between the control region 140 receiving the activation voltage and the passivation layer 170.

For the sub-pixels SP1 to SP4 included in the unit pixel (PX), a region in which a plurality of circuits connected to the detection regions 130 of the respective sub-pixels SP1 to SP4 is disposed will hereinafter be referred to as a circuit region 310.

FIG. 3 illustrates an example of the plurality of circuits connected to each of the detection regions 130 respectively included in the first sub-pixel SP1 and the second sub-pixel SP2.

The circuit region 310 may include a plurality of circuits to process electrons captured by the detection region. The control signals RST, TRG, FDG, and SEL may be received from the row driver 41. In addition, a pixel voltage ($V_{px}$) may be a power-supply voltage (VDD) or a source voltage (VSS).

Although not shown in FIG. 2, the circuit region 310 may be disposed between the unit pixels (PXs). Alternatively, in some other implementations, the circuit region 310 may be formed to overlap with the unit pixels (PXs). The position of the circuit region 310 may vary depending on a layout structure of such pixels, without being limited thereto.

First, circuits for processing electrons captured by the detection region 130 included in the first sub-pixel SP1 will hereinafter be described in detail.

The circuit region 310 may include a reset transistor RX_1, a transfer transistor TX_1, a first capacitor C1_1, a second capacitor C2_1, a floating diffusion transistor FDX_1, a drive transistor DX_1, and a selection transistor SX_1.

The reset transistor RX_1 may be activated in response to a logic high level of the reset signal RST supplied to a gate electrode thereof, such that potential of the floating diffusion region FD_1 and potential of the detection region 130 may be reset to a predetermined level (e.g., the pixel voltage $V_{px}$). In addition, when the reset transistor RX_1 is activated (i.e., active state), the transfer transistor TX_1 can also be activated (i.e., active state) to reset the floating diffusion region FD_1.

The transfer transistor TX_1 may be activated (i.e., active state) in response to a logic high level of the transfer signal TRG supplied to a gate electrode thereof, such that electrons accumulated in the detection region 130 can be transmitted to the floating diffusion region FD_1.

The first capacitor C1_1 may be coupled to the floating diffusion region (FD_1), such that the first capacitor C1_1 can provide predefined electrostatic capacity.

The second capacitor C2_1 may be selectively coupled to the floating diffusion region FD_1 according to operations of the floating diffusion transistor FDX_1, such that the second capacitor C2_1 can provide additional predefined electrostatic capacity.

Each of the first capacitor C1_1 and the second capacitor C2_1 may include, for example, at least one of a Metal-Insulator-Metal (MIM) capacitor, a Metal-Insulator-Polysilicon (MIP) capacitor, a Metal-Oxide-Semiconductor (MOS) capacitor, and a junction capacitor.

The floating diffusion transistor FDX_1 may be activated (i.e., active state) in response to a logic high level of the floating diffusion signal FDG supplied to a gate electrode thereof, such that the floating diffusion transistor FDX_1 may couple the second capacitor C2_1 to the floating diffusion region FD_1.

For example, when the amount of incident light is sufficient to correspond to a relatively high illuminance condition, the row driver 41 may activate the floating diffusion transistor FDX_1, such that the floating diffusion transistor FDX_1 enters the active state and the floating diffusion region FD_1 can be coupled to the second capacitor C2_1. As a result, when the amount of incident light is sufficient to correspond to a high illuminance level, the floating diffusion region FD_1 can accumulate much more photocharges therein, which makes it possible to guarantee a high dynamic range (HDR).

When the amount of incident light is not sufficient and thus corresponds to a relatively low illuminance level, the row driver 41 may control the floating diffusion transistor FDX_1 to be deactivated (i.e., inactive state), such that the floating diffusion region FD_1 can be isolated from the second capacitor C2_1.

In some other implementations, the floating diffusion transistor FDX_1 and the second capacitor C2_1 may be omitted as necessary.

A drain electrode of the drive transistor DX_1 is coupled to the pixel voltage (Vpx) and a source electrode of the drive transistor DX_1 is coupled to a vertical signal line SL_1 through the selection transistor SX_1, such that a load (MOS) and a source follower circuit of a constant current source circuit CS_1 coupled to one end of the vertical signal line SL_1 can be constructed. Thus, the drive transistor DX_1 may output a current corresponding to potential of the floating diffusion node FD_1 coupled to a gate electrode of the drive transistor DX_1 to the vertical signal line SL_1 through the selection transistor SX_1.

The selection transistor SX_1 may be activated (i.e., active state) in response to a logic high level of the selection signal SEL supplied to a gate electrode thereof, such that the pixel signal generated from the drive transistor DX_1 can be output to the vertical signal line SL_1.

In order to process electrons captured by the detection region 130 included in the second sub-pixel SP2, the circuit region 310 may include a reset transistor RX_2, a transfer transistor TX_2, a first capacitor C1_2, a second capacitor C2_2, a floating diffusion transistor FDX_2, a drive transistor DX_2, and a selection transistor SX_2.

Whereas the circuits for processing electrons captured by the detection region 130 included in the second sub-pixel SP2 may operate at different time points from those of other circuits for processing electrons captured by the detection region 130 included in the first sub-pixel SP1, the circuits for processing electrons captured by the detection region 130 included in the second sub-pixel SP2 may be substantially identical in terms of structures and operations to the other circuits for processing electrons captured by the detection region 130 included in the first sub-pixel SP1. Thus, detailed descriptions of the structures and operations will herein be omitted for convenience of description.

The pixel signal transferred from the circuit region 310 to the vertical signal line SL_1 and the pixel signal transferred from the circuit region 310 to the vertical signal line SL_2 may be performed by noise cancellation and analog-to-digital (ADC) conversion processing, such that each of the pixel signals can be converted into image data.

Although each of the reset signal RST, the transfer signal TRG, the floating diffusion signal FDG, and the selection signal SEL shown in FIG. 3 is denoted by a single signal line, each of the reset signal RST, the transfer signal TRG, the floating diffusion signal FDG, and the selection signal SEL can be supplied through a plurality of signal lines (e.g., two signal lines). In this case, circuits for processing electrons captured by the detection region 130 included in the first sub-pixel SP1 and the other circuits for processing electrons captured by the detection region 130 included in the second sub-pixel SP2 can operate at different time points based on signals supplied through the plurality of signal lines.

Figure 4:
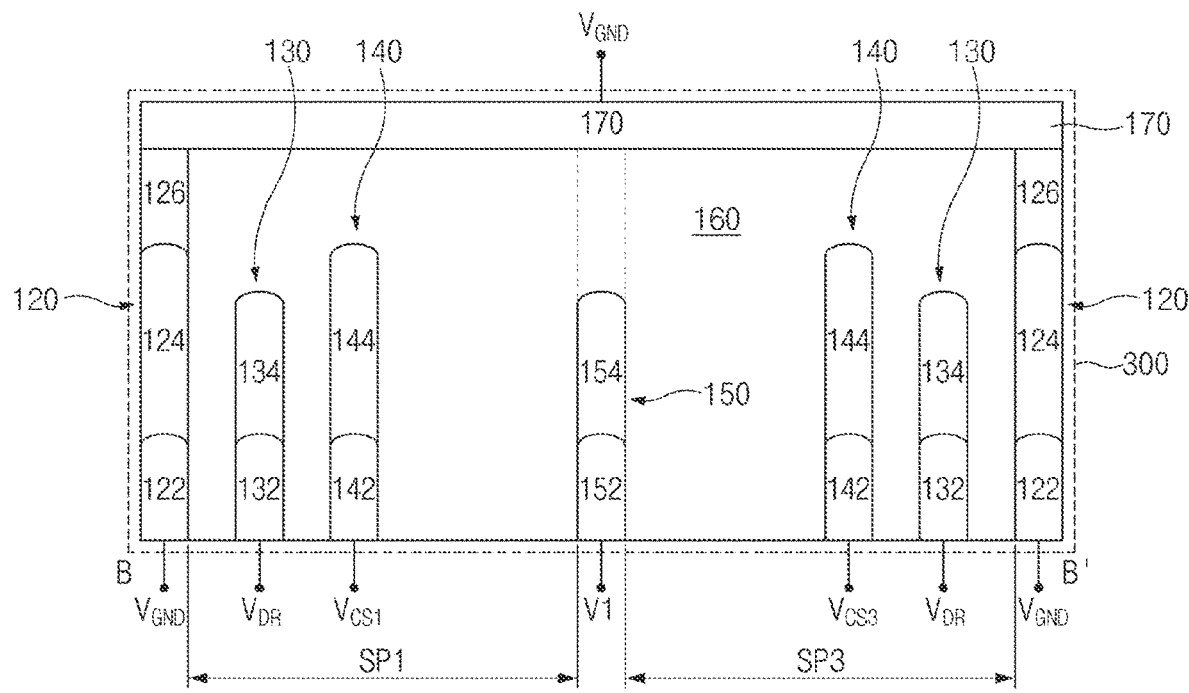
FIG. 4 is a cross-sectional view illustrating an example of the unit pixel taken along a second cutting line shown in FIG. 2 based on some implementations of the disclosed technology.

The image processor (not shown) may calculate first image data acquired from electrons captured by the first sub-pixel SP1, second image data acquired from electrons captured by the second sub-pixel SP2, third image data acquired from electrons captured by the third sub-pixel (not shown), and fourth image data acquired from the electrons captured by the fourth sub-pixel (not shown), thereby calculating a phase difference using the first to fourth image data, FIG. 4 is a cross-sectional view illustrating an example of the unit pixel (PX) taken along the second cutting line B-B' shown in FIG. 2 based on some implementations of the disclosed technology.

The circuit region (310 of FIG. 3) and the detection regions 130 connected to the circuit region (310 of FIG. 3) have been disclosed with reference to FIG. 3, and as such a detailed description of the circuit region (310 of FIG. 3) will herein be omitted from FIG. 4 for convenience of description. Although not shown in the drawings, it should be noted that circuits for processing captured electrons can also be connected to the detection region 130 included in the third sub-pixel SP3.

The second isolation portion 120, the detection region 130, the control region 140, the photoelectric conversion region 160, and the passivation layer 170 have already been described with reference to FIGS. 2 and 3, and as such a detailed description thereof will herein be omitted from FIG. 4.

Although FIG. 4 illustrates a cross-sectional view of the unit pixel taken along the line from the first sub-pixel SP1 to the third sub-pixel SP3 for convenience of description, the scope or spirit of the disclosed technology is not limited thereto, and the other cross-sectional view of the unit pixel taken along the line from the second sub-pixel SP2 to the fourth sub-pixel SP4 may be substantially the same as FIG. 4.

As can be seen from FIG. 4, the photoelectric conversion region 160 may be formed as one region in the entirety of the sub-pixels (e.g., SP1 and SP3).

The voltage applying region 150 may be formed at a center of the unit pixel (PX). In this case, the center of the unit pixel (PX) may refer to a position that is spaced apart by the same distance from the control regions 140 respectively included in the four adjacent sub-pixels SP1 to SP4.

The voltage applying region 150 may be doped with the same impurities as the first isolation portion 110 and the second isolation portion 120. For example, the voltage applying region 150 may be doped with P-type impurities.

The voltage applying region 150 may include a plurality of doped regions having different impurity densities. For example, the voltage applying region 150 may include an eleventh doped region 152 and a twelfth doped region 154.

The eleventh doped region 152 may have a higher density than the twelfth doped region 154. An eleventh depth where the eleventh doped region 152 is formed in the substrate may be smaller than a twelfth depth where the twelfth doped region 154 is formed in the substrate.

The eleventh depth may refer to a depth measured in the direction from one surface facing or opposite to a light reception surface of incident light to a boundary between the eleventh doped region 152 and the twelfth doped region 154. The twelfth depth may refer to a depth measured in the direction from a boundary between the eleventh doped region 152 and the twelfth doped region 154 to a boundary between the twelfth doped region 154 and the photoelectric conversion region 160.

A first voltage ($V_1$) may be applied to the voltage applying region 150. The first voltage ($V_1$) may be lower than each of the second voltage ($V_2$) and the third voltage ($V_3$) applied to the control region 140. For example, the first voltage ($V_1$) may be set to −0.2 V to −0.5 V.

As the first voltage ($V_1$) is applied to the voltage applying region 150, a current may flow between the voltage applying region 150 and the control region 140. As a difference between the first voltage ($V_1$) and the second voltage (i.e., activation voltage, $V_2$) applied to the control region 140 increases, a current may easily flow between the voltage applying region 150 and the control region 140.

Electrons generated by the photoelectric conversion region 160 may move by a current flowing between the voltage applying region 150 and the control region 140. When the second voltage (i.e., activation voltage, $V_2$) is applied to the control region 140, electrons generated by the photoelectric conversion region 160 may move from the voltage applying region 150 to the control region 140 receiving the second voltage ($V_2$).

A detection voltage ($V_{DR}$) may be applied to the detection region 130. As described above, the detection voltage ($V_{DR}$) may be higher than the second voltage ($V_2$). As the detection voltage ($V_{DR}$) is applied to the detection region 130, electrons having moved along a current flowing between the voltage applying region 150 and the control region 140 may be detected in the detection region 130.

Also, in some implementations, the detection region 130 may not be formed between the voltage applying region 150 and the control region 140. If the detection region 130 is formed between the voltage applying region 150 and the control region 140, flow of electrons between the voltage applying region 150 and the control region 140 may be interrupted by the detection voltage applied to the detection region 130.

If the first voltage ($V_1$) is lower than the third voltage ($V_3$), a current may flow between the control region 140 and the voltage applying region 150 even when the third voltage ($V_3$) is applied to the control region 140.

However, the intensity of the current flowing between the control region 140 receiving the third voltage ($V_3$) and the voltage applying region 150 may be smaller than the intensity of the current flowing between the control region 140 receiving the second voltage ($V_2$) and the voltage applying region 150.

A signal corresponding to electrons captured by the first sub-pixel SP1 may be referred to as a first sub-pixel signal. Similarly, a signal corresponding to electrons captured by the third sub-pixel SP3 may be referred to as a third sub-pixel signal.

The first sub-pixel signal and the third sub-pixel signal may be demodulation control signals (e.g., $V_{CS1}$ and $V_{CS3}$) having different phases with respect to the modulated light. The image processor (not shown) may generate phase data based on pixel signals detected by the sub-pixels SP1 to SP4.

Figure 5:
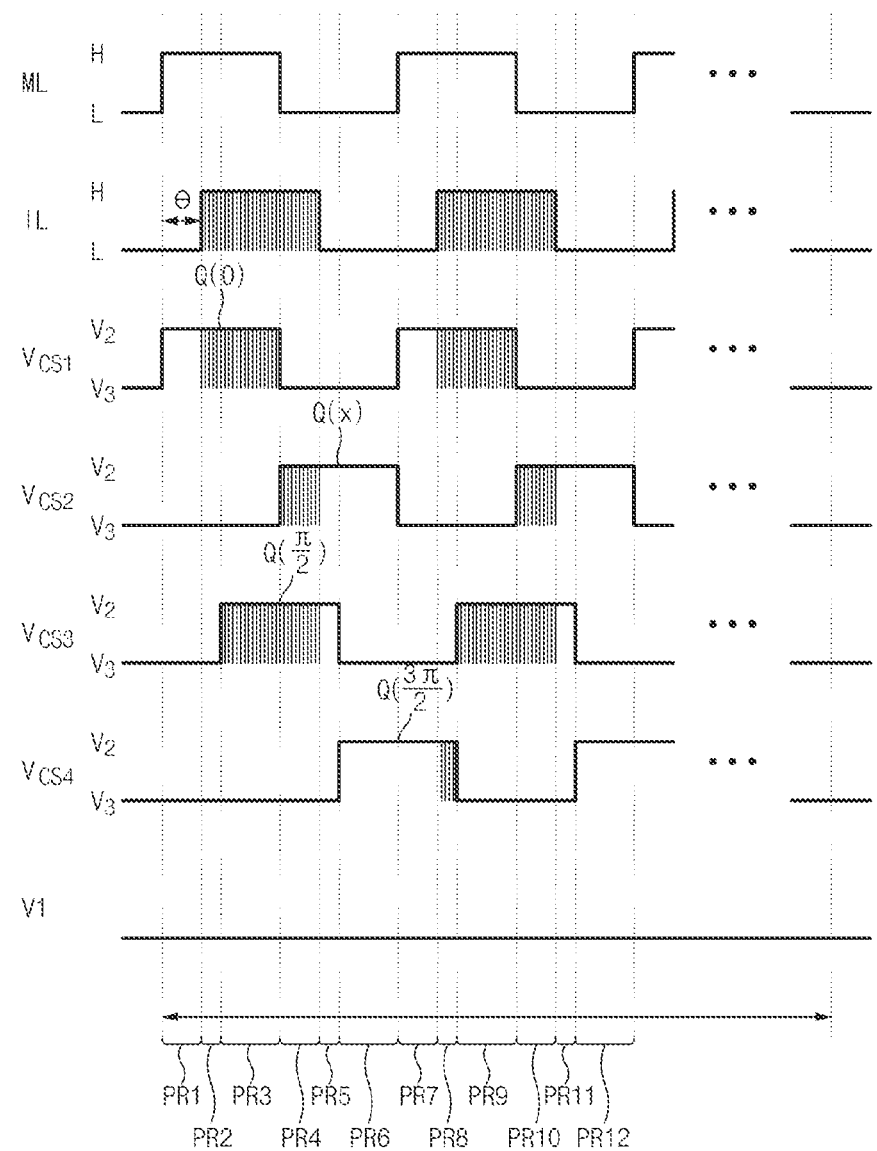
FIG. 5 is a timing diagram illustrating operations of the image sensing device based on some other implementations of the disclosed technology.

FIG. 5 is a timing diagram illustrating operations of the image sensing device ISD based on some other implementations of the disclosed technology.

The modulated light (ML), the incident light (IL), and the first to fourth demodulation control signals $V_{CS1}$~$V_{CS4}$ are illustrated in FIG. 5.

For sub-pixels (e.g., SP1 to SP4) included in one unit pixel (PX), the sub-pixels to which the demodulation control signal having the same phase is applied may be arranged at the same positions within the unit pixels (PXs) of the pixel array 30.

For convenience of description, the first to fourth demodulation control signals $V_{CS1}$ to $V_{CS4}$ respectively applied to the sub-pixels SP1 to SP4 included in the unit pixel (PX) shown in FIG. 2 will hereinafter be described with reference to FIG. 5.

The first to fourth demodulation control signals $V_{CS1}$ to $V_{CS4}$ may be generated by the demodulation driver 42, and may be applied to the control regions 140 respectively included in the sub-pixels (e.g., SP1 to SP4).

The first to fourth demodulation control signals $V_{CS1}$ to $V_{CS4}$ having different phase differences may be applied to the first to fourth sub-pixels SP1 to SP4, respectively. Each of the demodulation control signals $V_{CS1}$ to $V_{CS4}$ may have the same phase as the modulated light, and may have a predetermined phase difference with respect to the modulated light.

For example, the demodulation control signal ($V_{CS1}$) having no phase difference (i.e., 0 rad) with respect to the modulated light (ML) may be applied to the first sub-pixel SP1. In addition, the demodulation control signal ($V_{CS2}$) having a phase difference (i.e., π rad) with respect to the modulated light may be applied to the second sub-pixel SP2. The demodulation control signal ($V_{CS3}$) having a phase difference (i.e., π/2 rad) with respect to the modulated light may be applied to the third sub-pixel SP3. In addition, the demodulation control signal ($V_{CS4}$) having a phase difference (i.e., 3π/2 rad) with respect to the modulated light may be applied to the fourth sub-pixel SP4.

The first demodulation control signal ($V_{CS1}$) may be a signal for periodically applying the second voltage ($V_2$) and the third voltage ($V_3$) to the control region 140 of the first sub-pixel SP1.

Similarly, the second demodulation control signal ($V_{CS2}$) may be a signal for periodically applying the second voltage ($V_2$) and the third voltage ($V_3$) to the control region 140 of the second sub-pixel SP2 shown in FIG. 2. In addition, the third demodulation control signal ($V_{CS3}$) may be a signal for periodically applying the second voltage ($V_2$) and the third voltage ($V_3$) to the control region 140 of the third sub-pixel SP3 shown in FIG. 2. The fourth demodulation control signal ($V_{CS4}$) may be a signal for periodically applying the second voltage ($V_2$) and the third voltage ($V_3$) to the control region 140 of the fourth sub-pixel SP4 shown in FIG. 2.

The first sub-pixel SP1 may detect electrons corresponding to incident light received at a time point where the first demodulation control signal ($V_{CS1}$) has the second voltage ($V_2$). The second sub-pixel SP2 may detect electrons corresponding to incident light received at a time point where the second demodulation control signal ($V_{CS2}$) has the second voltage ($V_2$). The third sub-pixel SP3 may detect electrons corresponding to incident light received at a time point where the third demodulation control signal ($V_{CS3}$) has the second voltage ($V_2$). The fourth sub-pixel SP4 may detect electrons corresponding to incident light received at a time point where the fourth demodulation control signal ($V_{CS4}$) has the second voltage ($V_2$).

For example, electrons generated by each of the first to fourth sub-pixels SP1 to SP4 may be captured by the detection region 130 when each of the first to fourth demodulation control signals $V_{CS1}$ to $V_{CS4}$ has the second voltage ($V_2$).

After the captured electrons have moved through the transfer transistor TX, electrons accumulated in the floating diffusion region (FD) may be output as a pixel signal after passing through the drive transistor DX and the selection transistor SX.

After the pixel signal has been output, the first to fourth sub-pixels SP1 to SP4 may be reset to a predetermined voltage (e.g., a pixel voltage $V_{px}$) by the reset transistor RX.

Each of the sub-pixels SP1 to SP4 may include the reset transistor RX and the transfer transistor TX, such that the reset signal RST and the transfer signal TRG may be applied to each of the sub-pixels SP1 to SP4. The reset signal RST and the transfer signal TRG may be applied to each of the sub-pixels SP1 to SP4 by the row driver 41.

While the pixel signal of the unit pixel (PX) is detected, the first voltage ($V_1$) may be applied to the voltage applying region 150. As described above, since the first voltage ($V_1$) is applied to the voltage applying region 150, electrons can be easily detected by the detection region 130, and noise caused by movement of electrons flowing between the adjacent sub-pixels (e.g., SP1 and SP3) can be reduced.

The modulated light (ML) may refer to light that is emitted to the target object 1 by the light source 10 controlled by the control block 40. The modulated light (ML) may be generated to alternately have a high-level section (i.e., a period in which light is emitted) and a low-level section (i.e., a period in which light is not emitted).

The incident light (IL) may refer to light that is incident upon the substrate to generate electron-hole pairs through the photoelectric conversion effect. The incident light (IL) may have a phase difference (θ) that is changed with the distance between the image sensing device ISD and the target object 1.

The level of each of the modulated light (ML) and the incident light (IL) shown in FIG. 5 may refer to the intensity of light. For example, "H" may refer to high-intensity light, and "L" may refer to low-intensity light.

While electrons generated by the incident light (IL) are captured in the detection region 130 included in each of the sub-pixels SP1~SP4, each of the first demodulation control signal ($V_{CS1}$), the second demodulation control signal ($V_{CS2}$), the third demodulation control signal ($V_{CS3}$), and the fourth demodulation control signal ($V_{CS4}$) may alternately apply the second voltage ($V_2$) and the third voltage ($V_3$) to the connected control region 140 at intervals of a predetermined time.

A logic level of the demodulation driver 42 for applying the second voltage ($V_2$) to the control region 140 by the demodulation control signal may be considered to be a logic high level (H). In addition, a logic level of the demodulation driver 42 for applying the third voltage ($V_3$) to the control region 140 by the demodulation control signal may be considered to be a logic low level (L). For example, the second voltage ($V_2$) may be 1.2 V, and the third voltage ($V_3$) may be zero volts (0V).

In addition, the first demodulation control signal ($V_{CS1}$) may have the same phase as the modulated light (ML), the second demodulation control signal ($V_{CS2}$) may have a phase difference of 180° (π) with respect to the modulated light (ML), the third demodulation control signal ($V_{CS3}$) may have a phase difference of 90° (π/2) with respect to the modulated light (ML), and the fourth demodulation control signal ($V_{CS4}$) may have a phase difference of 270° (3π/2) with respect to the modulated light (ML).

In some implementations, it is assumed that no phase difference occurs between the light modulation signal MLS generating the modulated light (ML) and the modulated light (ML) for convenience of description, such that the light modulation signal MLS and the modulated light (ML) may have the same phase.

The second voltage ($V_2$) and the third voltage ($V_3$) are periodically applied to the control region 140 included in each of the sub-pixels SP1~SP4 by the first to fourth demodulation control signals $V_{CS1}$~$V_{CS4}$, such that the detection operation of the sub-pixels SP1~SP4 will hereinafter be described centering upon first to twelfth periods PR1~PR12.

The first demodulation control signal ($V_{CS1}$) may have the second voltage ($V_2$) in the first period PR1, the second period PR2, the third period PR3, the seventh period PR7, the eighth period PR8, and the ninth period PR9, and may have the third voltage ($V_3$) in the remaining periods other than the above periods PR1~PR3 and PR7~PR9.

The second demodulation control signal ($V_{CS2}$) may have the second voltage ($V_2$) in the fourth period PR4, the fifth period PR5, the sixth period PR6, the ninth period PR9, the eleventh period PR11, and the twelfth period PR12, and may have the third voltage ($V_3$) in the remaining periods other than the above periods PR4~PR6, PR9, PR11, and PR12.

The third demodulation control signal ($V_{CS3}$) may have the second voltage ($V_2$) in the third period PR3, the fourth period PR4, the fifth period PR5, the ninth period PR9, the tenth period PR10, and the eleventh period PR11, and may have the third voltage ($V_3$) in the remaining periods other than the above periods PR3~PR5 and PR9~PR11.

The fourth demodulation control signal ($V_{CS4}$) may have the second voltage ($V_2$) in the sixth period PR6, the seventh period PR7, the eighth period PR8, and the twelfth period PR12, and may have the third voltage ($V_3$) in the remaining periods other than the above periods PR6~PR8 and PR12.

The first to fourth demodulation control signals $V_{CS1}$~$V_{CS4}$ respectively applied to the sub-pixels SP1~SP4 included in one unit pixel (PX) may simultaneously have the second voltage ($V_2$) in a specific period. Thus, the second voltage ($V_2$) can be simultaneously applied to two arbitrary sub-pixels (e.g., SP1 and SP3) included in one unit pixel (PX).

For example, the first demodulation control signal ($V_{CS1}$) applied to the first sub-pixel SP1 and the third demodulation control signal ($V_{CS3}$) applied to the third sub-pixel SP3 may simultaneously have the second voltage ($V_2$) in the third period PR3 and the ninth period PR9. Accordingly, the second voltage ($V_2$) may be applied to the control regions 140 respectively included in the first sub-pixel SP1 and the third sub-pixel SP3 during the third period PR3 and the ninth period PR9.

The first isolation portion 110 included in the unit pixel (PX) may control movement of electrons flowing between the adjacent sub-pixels (e.g., SP1 and SP2), such that the demodulation driver 42 can capture electrons by simultaneously applying the second voltage ($V_2$) to the adjacent sub-pixels (e.g., SP1 and SP3).

The demodulation control signals for applying the second voltage ($V_2$) to the control regions 140 respectively included in the adjacent sub-pixels SP1~SP4 are simultaneously applied to the control regions 140, such that the time for detecting electrons from each of the sub-pixels SP1~SP4 can be reduced.

The incident light (IL) having a phase difference (θ) with respect to the modulated light (ML) may be incident upon the substrate. For example, the incident light (IL) may have a high intensity (H) indicating a high level in the second period PR2, the third period PR3, the fourth period PR4, the eighth period PR8, the ninth period PR9, and the tenth period PR10.

Each of the first to fourth sub-pixels SP1~SP4 may capture electrons generated by the incident light (IL) in a time period in which the demodulation control signals $V_{CS1}$~$V_{CS4}$ respectively applied to the first to fourth sub-pixels SP1~SP4 have the logic high level (H).

The first sub-pixel SP1 may capture electrons generated by the incident light (IL) in the second period PR2, the third period PR3, the eighth period PR8, and the ninth period PR9.

The first demodulation control signal ($V_{CS1}$) applied to the first sub-pixel SP1 may be configured in a manner that the second voltage ($V_2$) and the third voltage ($V_3$) are periodically repeated, such that the amount of electrons that are captured by the first sub-pixel SP1 in the second period PR2 and the third period PR3 may be identical to the amount of electrons that are captured by the first sub-pixel SP1 in the eighth period PR8 and the ninth period PR9. In this case, the electrons captured by the first sub-pixel SP1 in the second period PR2 and the third period PR3 may be defined as Q(0).

The second sub-pixel SP2 may capture electrons generated by the incident light (IL) in the fourth period PR4 and the tenth period PR10.

The second demodulation control signal ($V_{CS2}$) applied to the second sub-pixel SP2 may be configured in a manner that the second voltage ($V_2$) and the third voltage ($V_3$) are periodically repeated, such that the amount of electrons that are captured by the second sub-pixel SP2 in the fourth period PR4 may be identical to the amount of electrons that are captured by the second sub-pixel SP2 in the tenth period PR10. In this case, the electrons captured by the second sub-pixel SP2 in the fourth period PR4 may be defined as Q(π).

The third sub-pixel SP3 may capture electrons generated by the incident light (IL) in the third period PR3, the fourth period PR4, the ninth period PR9, and the tenth period PR10.

The third demodulation control signal ($V_{CS3}$) applied to the third sub-pixel SP3 may be configured in a manner that the second voltage ($V_2$) and the third voltage ($V_3$) are periodically repeated, such that the amount of electrons that are captured by the third sub-pixel SP3 in the third period PR3 and the fourth period PR4 may be identical to the amount of electrons that are captured by the third sub-pixel SP3 in the ninth period PR9 and the tenth period PR10. In this case, the electrons captured by the third sub-pixel SP3 in each of the third period PR3 and the fourth period PR4 may be defined as Q(π/2).

The fourth sub-pixel SP4 may capture electrons generated by the incident light (IL) in the eighth period PR8.

In this case, the electrons captured by the fourth sub-pixel SP4 in the eighth period PR8 may be defined as Q(3π/2).

The image sensing device ISD may perform the sensing operation and the distance information detection in units of four adjacent unit pixels (e.g., SP1, SP2, SP3, and SP4) included in one unit pixel (PX).

Each of the unit pixels (PXs) arranged in the pixel array 30 may include the first to fourth sub-pixels SP1, SP2, SP3 and SP4. Each of the first to fourth sub-pixels SP1~SP4 may receive any one of the first to fourth demodulation control signals $V_{CS1}$~$V_{CS4}$. That is, the sub-pixels SP1~SP4 arranged in the pixel array 30 may receive the demodulation control signals $V_{CS1}$~$V_{CS4}$, respectively.

Each of the sub-pixels SP1, SP2, SP3 and SP4 may output a pixel signal corresponding to electrons applied to the floating diffusion region FD. The image processor (not shown) may acquire the distance from the image sensing device ISD to the target object 1 by processing the output pixel signal.

The image sensing device ISD may calculate a phase difference (θ) using the detected electrons Q(0), Q(π/2), Q(π), and Q(3π/2).

The electrons generated by incident light (IL) applied to the pixel array 30 may be divisionally captured by four adjacent sub-pixels SP1, SP2, SP3 and SP4 in different ways according to the respective phases.

Each of the first demodulation control signal ($V_{CS1}$) for acquiring the electrons Q(0), the second demodulation control signal ($V_{CS2}$) for acquiring the electrons Q(π), the third demodulation control signal ($V_{CS}$) for acquiring the electrons Q(π/2), and the fourth demodulation control signal ($V_{CS4}$) for acquiring the electrons Q(3π/2) may have a phase difference of π/2 (rad), the image processor (not shown) may receive image data corresponding to Q(0), image data corresponding to Q(π), image data corresponding to Q(π/2), and image data corresponding to Q(3π/2) from the four adjacent sub-pixels SP1, SP2, SP3 and SP4, respectively.

The image processor (not shown) may calculate a phase difference based on the image data, and may acquire the distance from the image sensing device ISD to the target object 1.

Figure 6:
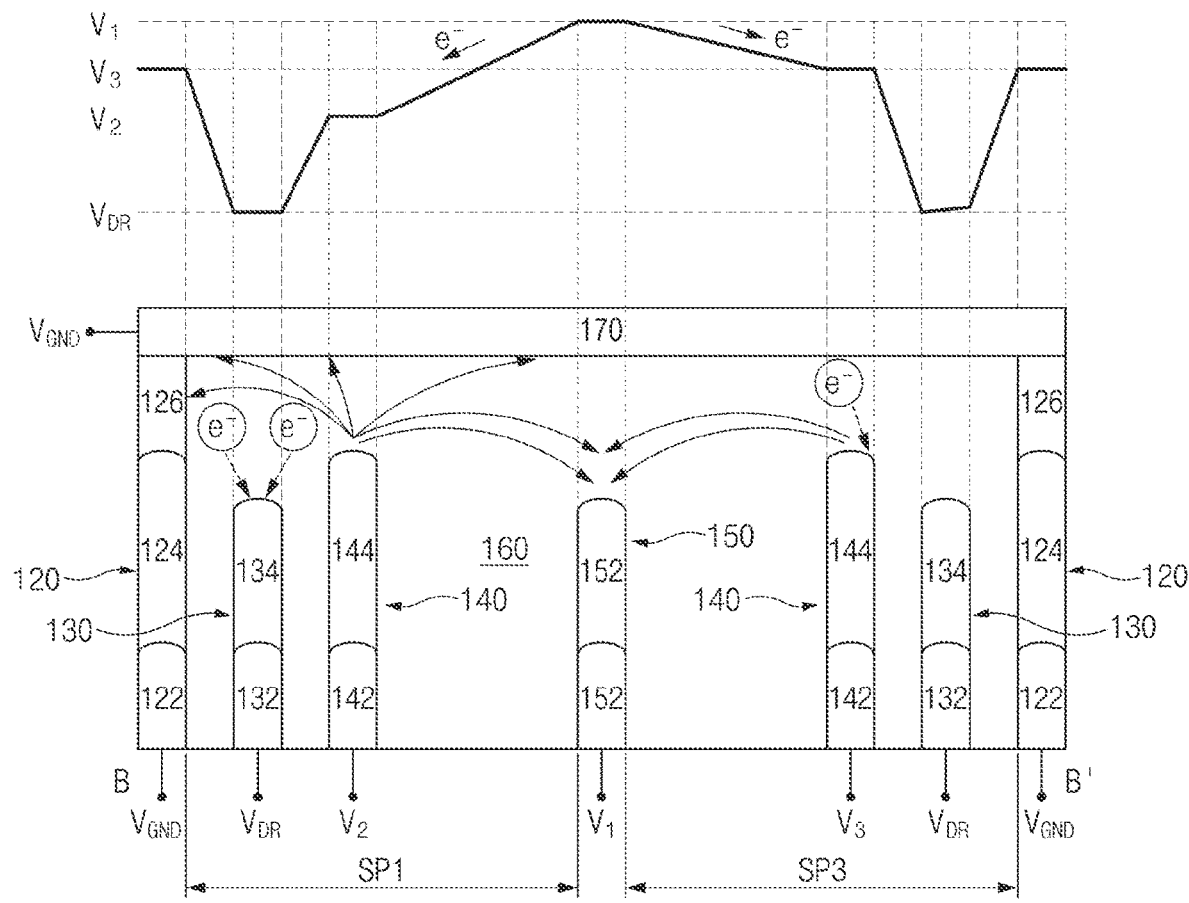
FIG. 6 is a conceptual diagram illustrating an example of voltages to be applied to a unit pixel during an operation time of the unit pixel, and a distribution of potentials generated in the operating unit pixel based on some implementations of the disclosed technology.

FIG. 6 is a conceptual diagram illustrating an example of voltages to be applied to the unit pixel (PX) during an operation time of the unit pixel (PX), and a distribution of potentials generated in the operating unit pixel (PX) based on some implementations of the disclosed technology.

As can be seen from FIG. 6, while the unit pixel (PX) operates in the seventh period PR7 and the eighth period PR8, voltages applied to the first sub-pixel SP1 and the third sub-pixel SP3 are illustrated in FIG. 6.

Although FIG. 6 exemplarily illustrates the operation time points of the seventh period PR7 and the eighth period PR8 for convenience of description, a potential distribution in two arbitrary sub-pixels (e.g., SP2 and SP4) included in the unit pixel (PX) during the operation times of the fourth and fifth periods PR4 and PR5 may also be substantially the same as FIG. 6. At this time, a region of the second sub-pixel SP2 may correspond to a region of the first sub-pixel SP1 shown in FIG. 6, and a region of the fourth sub-pixel SP4 may correspond to a region of the third sub-pixel SP3 shown in FIG. 6.

In addition, the first to fourth demodulation control signals $V_{CS1}$~$V_{CS4}$ respectively applied to the sub-pixels SP1~SP4 may be repeated at intervals of a predetermined time, such that the above-mentioned potential distribution can also be equally applied to other operation time points.

For example, for the first and second periods PR1 and PR2, voltages applied to the first sub-pixel SP1 and the third sub-pixel SP3 may be substantially the same as those of FIG. 6.

Referring to FIG. 6, during the seventh period PR7 and the eighth period PR8, the second voltage ($V_2$) (e.g., 1.2 V) may be applied to the control region 140 included in the first sub-pixel SP1, and the third voltage ($V_3$) (e.g., 0V) may be applied to the control region 140 included in the second sub-pixel SP2.

In addition, the first voltage (e.g., −0.2 V to −0.5 V) may be applied to the voltage applying region 150, and the ground voltage ($V_{GND}$) (e.g., 0V) may be applied to the second isolation portion 120.

In this case, some parts of a current flowing between the voltage applying region 150 and the control region 140 are illustrated in FIG. 6. In addition, a current may also flow between the control region 140 included in the first sub-pixel SP1 and the second isolation portion 120.

Flow of such current may be opposite in direction to movement of electrons. When the current flows from the control region 140 included in the first sub-pixel SP1 to the voltage applying region 150, electrons may move from the voltage applying region 150 to the control region included in the first sub-pixel SP1.

During the operation time of the unit pixel (PX), the detection voltage ($V_{DR}$) can be applied to the detection region 130. In this case, the detection region 130 may capture electrons moving along the current.

When a negative(−) voltage is applied to the voltage applying region 150, a potential difference may occur between the voltage applying region 150 and the control region 140 to which the third voltage ($V_3$) is applied. A current may flow from the control region 140 receiving the third voltage ($V_3$) to the voltage applying region 150 receiving the negative(−) voltage (e.g., first voltage, $V_1$). Referring to FIG. 6, a current may flow between the control region 140 included in the third sub-pixel SP3 and the voltage applying region 150.

Since a potential difference occurs between the control region 140 receiving the third voltage ($V_3$) and the voltage applying region 150, the amount of electrons moving from the sub-pixel (e.g., SP3) receiving the third voltage ($V_3$) to the sub-pixel (e.g., SP1) receiving the second voltage ($V_2$) can be reduced. At this time, the electrons restricted in movement may be electrons (e.g., electrons generated in the third sub-pixel SP3 in the third to fifth periods PR3~PR5) generated in the previous detection operation time.

If there is no potential difference between the voltage applied to the voltage applying region 150 and the voltage applied to the control region 140, electrons, that have been generated from the sub-pixel (e.g., SP3 of FIG. 6) receiving the third voltage ($V_3$) and but not captured in the detection operation, can easily move toward the sub-pixel (e.g., SP1 of FIG. 6) receiving the second voltage ($V_2$).

When the negative(−) voltage ($V_1$) is applied to the voltage applying region 150, the first voltage ($V_1$) is lower than the third voltage ($V_3$), so that a current can flow between the voltage applying region 150 and the control region 140 receiving the third voltage ($V_3$).

As a result, electrons, that have been generated in the sub-pixel (e.g., SP3 of FIG. 6) and but not captured in the detection operation, may not easily move toward the adjacent sub-pixel (e.g., SP1 of FIG. 6).

FIG. 6 illustrates a potential energy distribution corresponding to the cross-section of the unit pixel (PX).

Electrons may move from a low-voltage region to a high-voltage region. As the voltage of the region becomes lower, this means that potential energy of electrons generated in the region becomes higher.

As can be seen from FIG. 5, the first voltage ($V_1$) may be applied to the voltage applying region 150 during the operation time of the unit pixel (PX).

Since the first voltage ($V_1$) is at a low voltage (e.g., −0.2 V to −0.5 V) less than each of the second voltage ($V_2$), the third voltage ($V_3$), and the detection voltage ($V_{DR}$), electrons of the region to which the first voltage ($V_1$) is applied may have the highest potential.

In the first period PR1 and the second period PR2 shown in FIG. 5, the second voltage ($V_2$) may be applied to the control region 140 of the first sub-pixel SP1. The second voltage ($V_2$) is higher than the third voltage ($V_3$) and is lower than the first voltage ($V_1$), such that electrons generated in the first sub-pixel SP1 can move toward the region to which the second voltage ($V_2$) is applied.

The third voltage ($V_3$) may be applied to the control region 140 of the third sub-pixel SP3. Since the third voltage ($V_3$) is higher than the first voltage ($V_1$), electrons generated in the third sub-pixel SP3 may not easily go over the voltage applying region 150. As a result, occurrence of noise caused by movement of electrons generated in the adjacent sub-pixels by the first voltage ($V_1$) applied to the voltage applying region 150 can be prevented.

The detection voltage ($V_{DR}$) may be applied to the detection regions 130 included in the unit pixel (PX). For example, the detection voltage ($V_{DR}$) may be set to 2.8 V. Electrons generated in the sub-pixels (e.g., SP1~SP4) may move toward the detection regions 130 corresponding to the lowest-potential regions.

The sub-pixels (e.g., SP1~SP4) included in each unit pixel (PX) can be isolated from the adjacent unit pixels (PXs) by the second isolation portion 120. The second isolation portion 120 may physically and electrically isolate the photoelectric conversion regions 160 respectively included in the unit pixels (PXs) from each other.

Since the second isolation portion 120 is formed to have the same depth as a formation depth of the photoelectric conversion region 160, movement of electrons flowing between the adjacent unit pixels (PXs) can be prevented.

In addition, when the ground voltage ($V_{GND}$) is applied to the second isolation portion 120 and is lower than the detection voltage ($V_{DR}$), electrons can be prevented from moving toward the adjacent unit pixels (PXs) by the second isolation portion 120.

Figure 7:
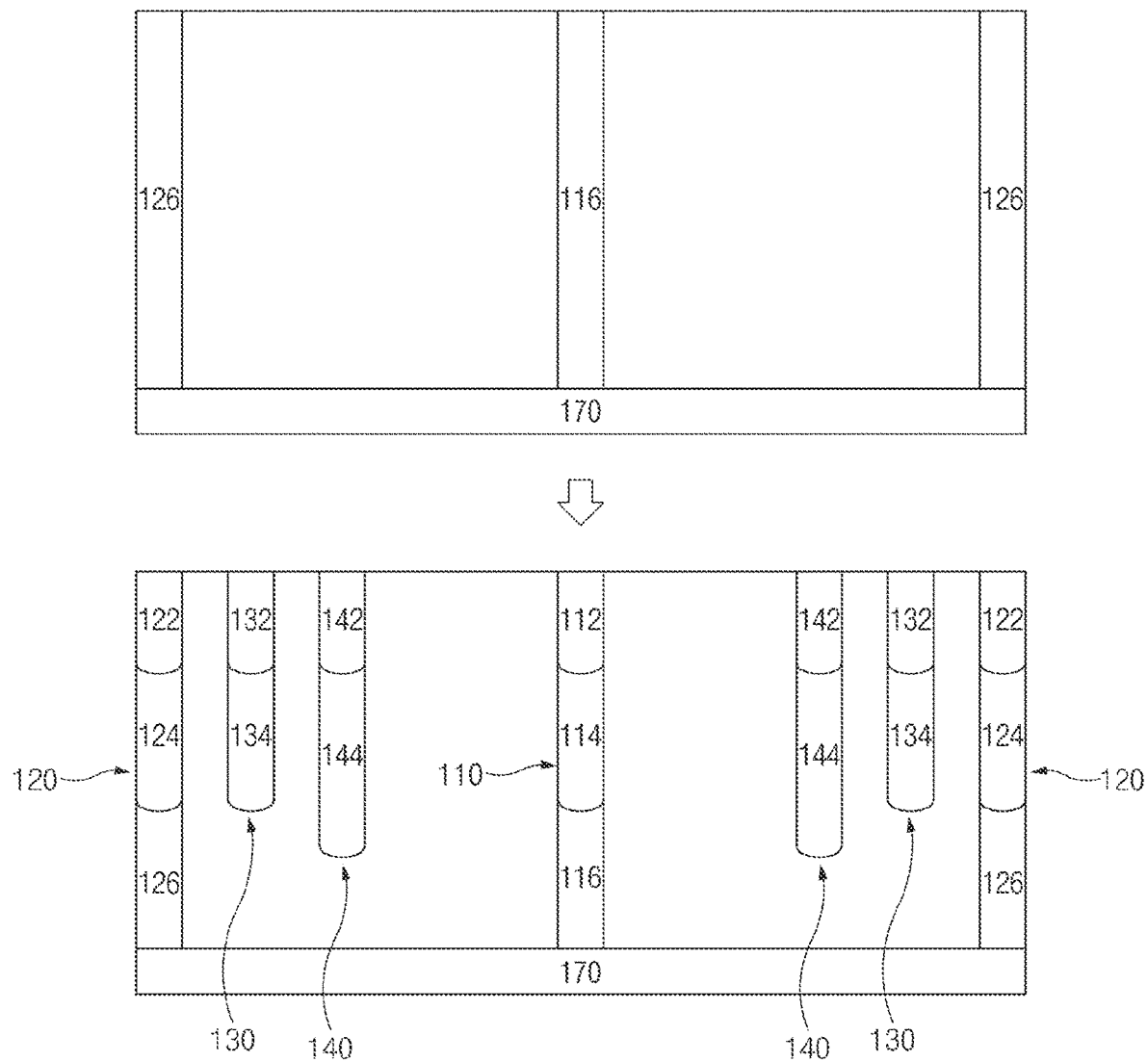
FIGS. 7 and 8 are conceptual diagrams illustrating examples of a method for forming a first isolation portion and a second isolation portion based on some implementations of the disclosed technology.
Figure 8:
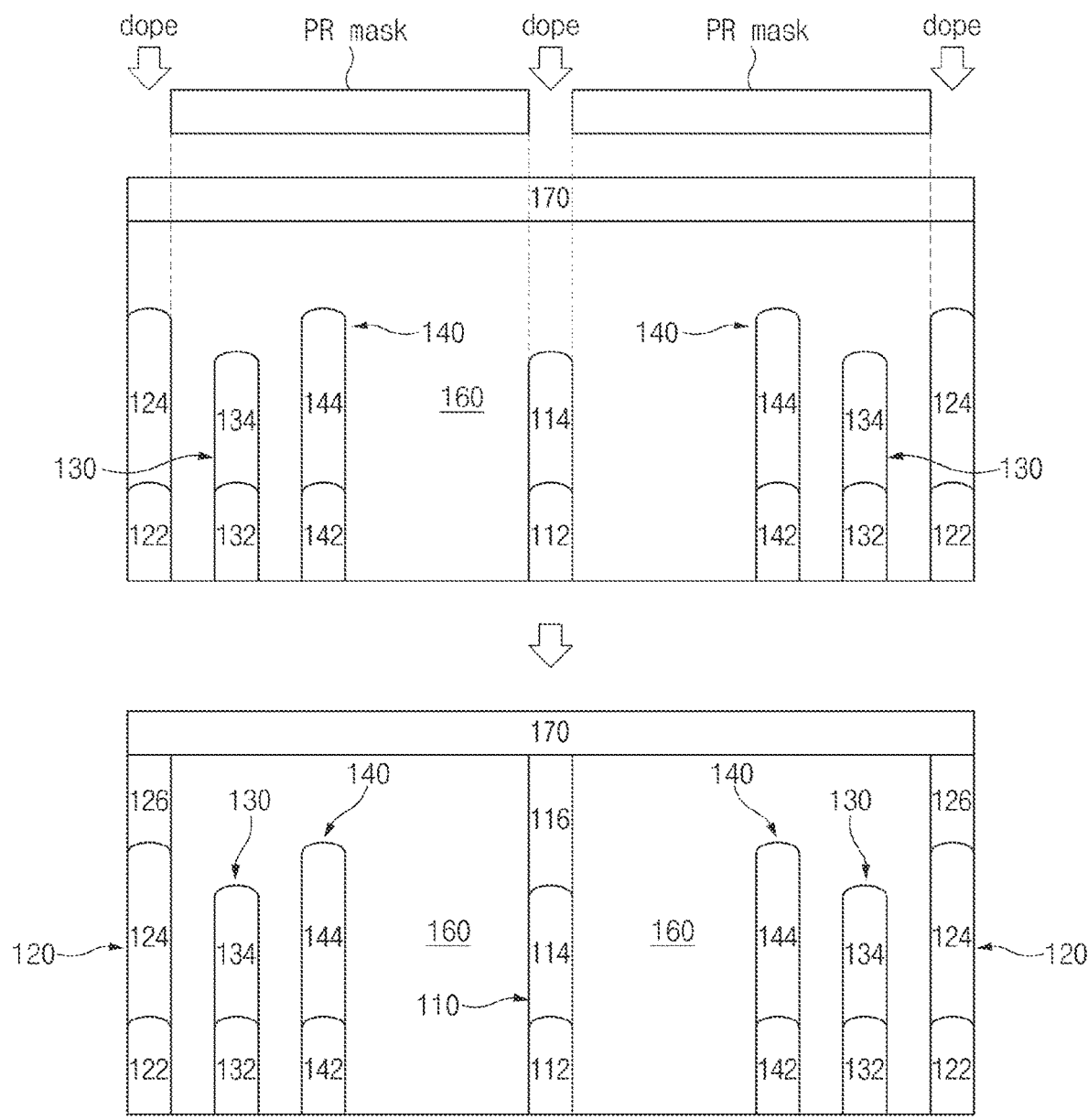

FIGS. 7 and 8 are diagrams illustrating examples of a method for forming the first isolation portion and the second isolation portion based on some implementations of the disclosed technology.

Referring to FIG. 7, the first isolation portion 110 may include a first doped region 112, a second doped region 114, and a third doped region 116. The second isolation portion 120 may include a fourth doped region 122, a fifth doped region 124, and a sixth doped region 126.

The third doped region 116 may have a lower density than the first doped region 112, and may be formed by ion implantation. The sixth doped region 126 may have a lower density than the fourth doped region 122, and may be formed by ion implantation. In this case, a conductivity-type of the implanted ions may be a P-type, and P-type ions may be used for such ion implantation.

In the example of FIG. 7, the depth of the isolation portions 110 and 120 that are formed by the ion implantation process may be restricted by the limit of the ion implantation depth.

In the example of FIG. 7, when the third doped region 116 is formed to have the same direction as the first doped region 112 and the second doped region 114 when viewed from the substrate, the formation depth of the first isolation portion 110 can be restricted. Similarly, when the sixth doped region 126 is formed to have the same direction as the fourth doped region 122 and the fifth doped region 124 when viewed from the substrate, the formation depth of the second isolation portion 120 can be restricted. In some implementations, 'formed to have same direction' may mean that impurities are doped from the same direction of a frontside of the substrate or a backside of the substrate.

Therefore, when the doped regions included in the first isolation portion 110 and the second isolation portion 120 are formed after being doped in the same direction with respect to the substrate, the thickness of either the substrate or the epitaxial layer in which the first isolation portion 110 and the second isolation portion 120 are doped can be restricted.

Referring to FIG. 8, the first isolation portion 110 may include a first doped region 112, a second doped region 114, and a third doped region 116. The second isolation portion 120 may include a fourth doped region 122, a fifth doped region 124, and a sixth doped region 126.

Unlike the embodiment of FIG. 7, the embodiment of FIG. 8 illustrates that the third doped region 116 is doped in a direction opposite to the first and second doped regions 112 and 114 with respect to the substrate. Similarly, the sixth doped region 126 may be doped in the direction opposite to the fourth and fifth doped regions 122 and 124 with respect to the substrate. For example, the first, second, fourth and fifth doped regions 112, 114, 122 and 124 can be doped from the frontside of the substrate and the third doped region 116 and the sixth doped region 126 can be doped from the backside of the semiconductor substrate or the epitaxial layer. The above-mentioned doping method of the third and sixth doped regions 116 and 126 may be referred to as a backside implantation process.

The third doped region 116 may have a lower density than the first doped region 112, and may be formed by an ion implantation process. Similarly, the sixth doped region 126 may have a lower density than the fourth doped region 122, and may be formed by the ion implantation process. The conductivity-type of the implanted ions may be a P-type, such that P-type ions may be used for such ion implantation.

When the third doped region 116 is doped in a direction opposite to the first and second doped regions 112 and 114, the first isolation portion 110 may be formed over the entirety of the semiconductor substrate or the epitaxial layer without limiting the thickness of the epitaxial layer or the semiconductor substrate.

Similarly, when the sixth doped region 126 is doped in a direction opposite to the fourth and fifth doped regions 122 and 124, the second isolation portion 120 may be formed over the entirety of the semiconductor substrate or the epitaxial layer without limiting the thickness of the epitaxial layer or the semiconductor substrate.

In the example of FIG. 8, the third doped region 116 and the sixth doped region 126 can be formed after the first doped region 112, the second doped region 114, the fourth doped region 122, and the fifth doped region 124 are formed.

In addition, the position where the impurities for forming the third doped region 116 and the sixth doped region 126 are doped can be determined using a photoresist (PR) mask in a manner that the isolation portions 110 and 120 can be formed simultaneously with formation of the first doped region 112, the second doped region 114, the fourth doped region 122, and the fifth doped region 124.

Figure 9:
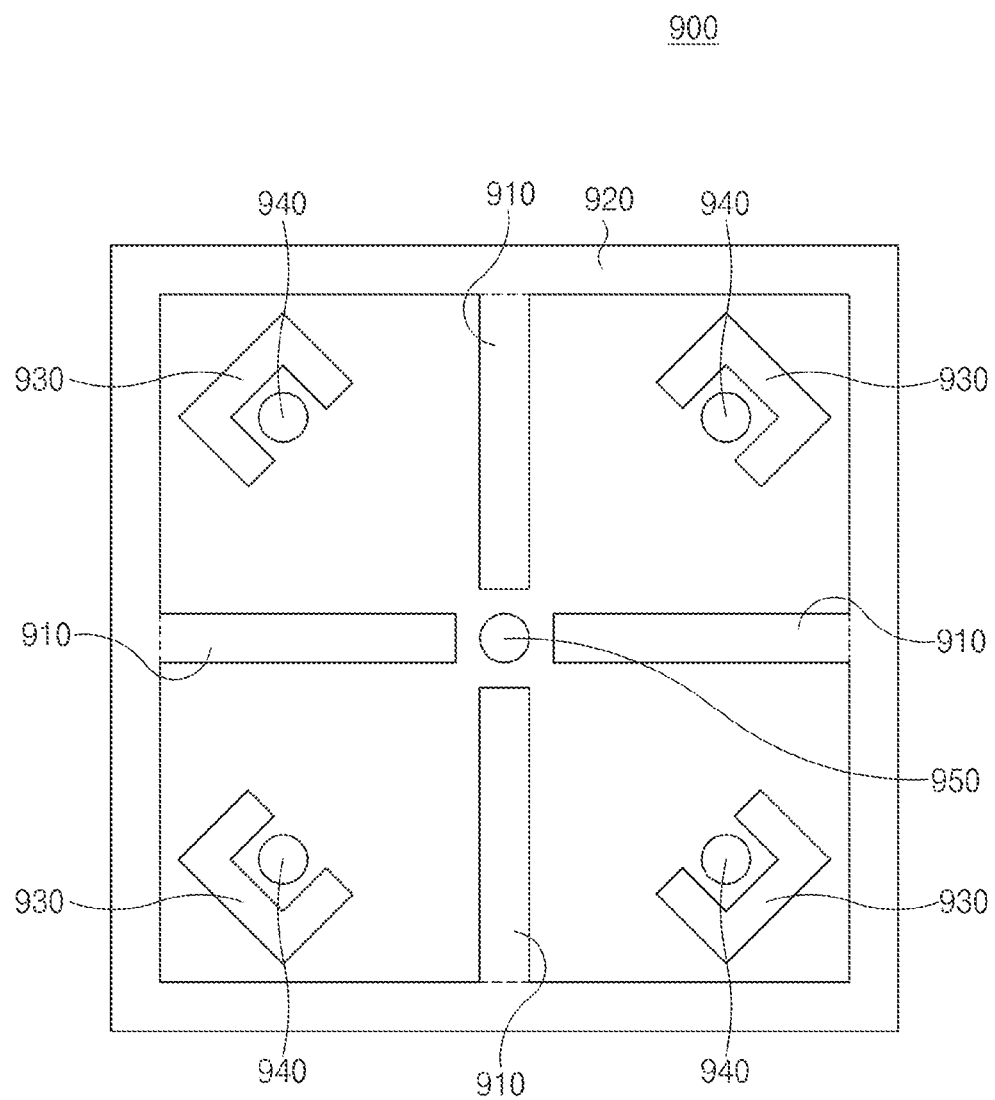
FIG. 9 is a schematic diagram illustrating an example of a unit pixel having detection regions based on some other implementations of the disclosed technology.

FIG. 9 is a schematic diagram illustrating an example of a unit pixel 900 having a plurality of detection regions 930 based on some other implementations of the disclosed technology.

Referring to FIG. 9, each of the detection regions 930 may be formed around each of the control regions 940, and may be formed to open a gap (spacing) between the voltage applying region 950 and each of the control regions 940.

When each of the detection regions 930 is formed to be opened between the voltage applying region 950 and each of the control regions 940, a current flowing between the voltage applying region 950 and each of the control regions 940 may not be affected by the detection voltage ($V_{DR}$).

In addition, for the respective sub-pixels SP1~SP4, the control region 940 and the detection region 930 included in each of the sub-pixels SP1~SP4 may be formed adjacent to the second isolation portion 920.

If the control regions 940 and the detection regions 930 are formed adjacent to the second isolation portion 920, a path of a current flowing between the voltage applying region 950 and each of the control regions 940 receiving the second voltage ($V_2$) may increase in length as compared to the other case in which the control region 940 and the detection region 930 are formed at the center of each of the sub-pixels SP1~SP4.

If the path of the current flowing between the voltage applying region 950 and each of the control regions 940 receiving the second voltage ($V_2$) increases in length, electrons generated by the respective sub-pixels SP1~SP4 can easily move along flow of the current.

Since the control regions 940 and the detection regions 930 are formed adjacent to the second isolation portion 920, electrons generated between the voltage applying region 950 and each of the control regions 940 can be easily captured through the detection regions 930.

As is apparent from the above description, the image sensing device based on some implementations of the disclosed technology can allow a control region included in a unit pixel to be surrounded by isolation portions, such that electron detection efficiency can be improved and signal interference between adjacent sub-pixels can be reduced.

In addition, due to a voltage applying region located at the center of each unit pixel, signal interference between the adjacent sub-pixels can be reduced and electron transfer efficiency can be improved.

The embodiments of the disclosed technology may provide a variety of effects capable of being directly or indirectly recognized through the above-mentioned disclosure.

Those skilled in the art will appreciate that the disclosed technology may be carried out in other specific ways than those set forth herein.

Although a number of illustrative embodiments have been described, it should be understood that modifications to the disclosed embodiments and other embodiments can be devised based on what is described and/or illustrated in this disclosure.

What is claimed is:

1. An image sensing device comprising:
   a plurality of unit pixels,
   wherein each of the unit pixels is structured to respond to incident light to produce photocharges indicative of detected incident light and includes:
   sub-pixels, each sub-pixel including a control region configured to generate, within a substrate in which the sub-pixels are disposed, a current that carries the photocharges; and
   a detection region spaced from the control region and configured to capture the photocharges carried by the current;
   a plurality of first isolation portions disposed between two adjacent sub-pixels;
   a second isolation portion disposed to surround the sub-pixels; and
   a voltage applying region disposed at a center portion of the unit pixel and configured to receive a first voltage.

2. The image sensing device according to claim 1, wherein:
   each of the first isolation portions and the second isolation portion are configured to receive a ground voltage higher than the first voltage.

3. The image sensing device according to claim 1, wherein each of the plurality of first isolation portions includes:
   a first doped region having a first depth;
   a second doped region having a second depth; and
   a third doped region formed to have a third depth,
   wherein a sum of the first depth, the second depth, and the third depth is identical to a depth of the substrate.

4. The image sensing device according to claim 3, wherein:
   the first doped region and the second doped region have different doping densities from each other.

5. The image sensing device according to claim 1, wherein the second isolation portion includes:
   a fourth doped region having a fourth depth;
   a fifth doped region having a fifth depth; and
   a sixth doped region having a sixth depth,
   wherein a sum of the fourth depth, the fifth depth, and the sixth depth is identical to a depth of the substrate.

6. The image sensing device according to claim 5, wherein:
   the fourth doped region and the fifth doped region have different doping densities from each other.

7. The image sensing device according to claim 1, wherein:
   the control region is configured to receive a demodulation control signal having a second voltage during a first period time and a third voltage during a second period of time.

8. The image sensing device according to claim 7, wherein:
   each of the second voltage and the third voltage is higher than the first voltage.

9. The image sensing device according to claim 8, wherein:
   the sub-pixels include a first to fourth sub-pixels to which different demodulation control signals are applied.

10. The image sensing device according to claim 9, wherein:
    a first to fourth demodulation control signals are applied to the first to fourth sub-pixels, respectively, and
    wherein the first demodulation control signal has a phase difference of 90° with respect to the second demodulation control signal;
    the second demodulation control signal has a phase difference of 90° with respect to the third demodulation control signal;
    the third demodulation control signal has a phase difference of 90° with respect to the fourth demodulation control signal; and
    the fourth demodulation control signal has a phase difference of 90° with respect to the first demodulation control signal.

11. The image sensing device according to claim 1, wherein:
    the detection region is disposed between the control region and the second isolation portion.

12. The image sensing device according to claim 11, wherein:
    the detection region is disposed to surround the control region,
    wherein an opening is disposed between the control region and the voltage applying region.

13. The image sensing device according to claim 1, wherein:

the current flows from each of the control region, the first isolation portions, and the second isolation portion toward the voltage applying region.

14. The image sensing device according to claim 1, wherein:
the voltage applying region is spaced apart from each of the first isolation portions.

15. An image sensing device comprising:
sub-pixels arranged in a matrix array, each sub-pixel including a photoelectric conversion region configured to produce photocharges in response to incident light;
a first isolation portion disposed to isolate any two adjacent sub-pixels from each other;
a second isolation portion disposed along edges of the sub-pixels; and
a voltage applying region disposed at a central portion of the matrix array and configured to receive a first voltage that is a negative voltage.

16. The image sensing device according to claim 15, wherein each of the sub-pixels further includes:
a detection region configured to capture the photocharges moving along a current; and
a control region configured to allow the current to flow toward the first isolation portion, the second isolation portion, and the voltage applying region.

17. The image sensing device according to claim 16, wherein:
the control region is further configured to generate a hole current by receiving a control signal having a second voltage or a third voltage.

18. The image sensing device according to claim 16, wherein:
the voltage applying region is disposed spaced apart from the first isolation portion and the second isolation portion.

19. The image sensing device according to claim 16, wherein the first isolation portion and the second isolation portion are coupled to each other.

20. The image sensing device according to claim 16, wherein voltages applied to the first isolation portion and the second isolation portion are different from the first voltage.

* * * * *